(12) United States Patent
Tanaka et al.

(10) Patent No.: US 12,513,994 B2
(45) Date of Patent: Dec. 30, 2025

(54) INSULATING TRANSFORMER

(71) Applicant: ROHM CO., LTD., Kyoto (JP)

(72) Inventors: Bungo Tanaka, Kyoto (JP); Keiji Wada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 98 days.

(21) Appl. No.: 18/474,233

(22) Filed: Sep. 26, 2023

(65) Prior Publication Data
US 2024/0014201 A1 Jan. 11, 2024

Related U.S. Application Data

(63) Continuation of application No. PCT/JP2022/015018, filed on Mar. 28, 2022.

(30) Foreign Application Priority Data

Mar. 29, 2021 (JP) .................. 2021-055720

(51) Int. Cl.
*H10D 86/85* (2025.01)
*H01L 23/00* (2006.01)
(Continued)

(52) U.S. Cl.
CPC ....... *H10D 86/85* (2025.01); *H01L 23/49575* (2013.01); *H01L 24/05* (2013.01);
(Continued)

(58) Field of Classification Search
CPC ... H01F 19/04; H01F 27/00; H01L 23/49562; H01L 23/49575; H01L 24/05; H01L 24/06; H01L 24/45; H01L 24/48; H01L 24/49; H01L 25/18; H01L 2224/05567; H01L 2224/06152; H01L 2224/0616; H01L 2224/45124; H01L 2224/45144; H01L 2224/45147; H01L 2224/48137; H01L 2224/49113; H01L 2224/49175;
(Continued)

(56) References Cited

U.S. PATENT DOCUMENTS

2017/0338788 A1* 11/2017 Yun .................. H03H 7/463
2018/0130587 A1* 5/2018 Tanaka .............. H01F 17/0013

FOREIGN PATENT DOCUMENTS

| DE | 112022000354 T5 | 10/2023 |
| JP | 2016006816 A * | 1/2016 |
| JP | 2018-078169 A | 5/2018 |

OTHER PUBLICATIONS

Machine translation of Akita Japanese Patent Document JP 2016-6816 A Jan. 2016 (Year: 2016).*

(Continued)

*Primary Examiner* — Kevin J Comber
(74) *Attorney, Agent, or Firm* — XSENSUS LLP

(57) ABSTRACT

An insulating transformer comprising: an insulation layer; a transformer including a first coil embedded in the insulation layer and a second coil; and a capacitor including a first capacitor electrode and a second capacitor electrode, the first capacitor electrode being arranged between the first coil and the second coil and connected to a first ground terminal, and the second capacitor electrode being arranged between the first capacitor electrode and the second coil and connected to a second ground terminal.

17 Claims, 24 Drawing Sheets

(51) Int. Cl.
  *H01L 23/495* (2006.01)
  *H01L 25/18* (2023.01)
(52) U.S. Cl.
  CPC .............. *H01L 24/06* (2013.01); *H01L 24/45* (2013.01); *H01L 24/48* (2013.01); *H01L 24/49* (2013.01); *H01L 25/18* (2013.01); *H01L 2224/05553* (2013.01); *H01L 2224/05567* (2013.01); *H01L 2224/06152* (2013.01); *H01L 2224/45124* (2013.01); *H01L 2224/45144* (2013.01); *H01L 2224/45147* (2013.01); *H01L 2224/48137* (2013.01); *H01L 2224/48245* (2013.01); *H01L 2224/49113* (2013.01); *H01L 2224/49175* (2013.01)
(58) Field of Classification Search
  CPC ........... H01L 2225/06531; H02M 1/08; H03K 17/691; H10D 1/20; H10D 1/68; H10D 86/85
  USPC ....................................................... 361/270
  See application file for complete search history.

(56) References Cited

OTHER PUBLICATIONS

International Search Report and Written Opinion mailed on May 17, 2022, received for PCT Application PCT/JP2022/015018, filed on Mar. 28, 2022, 12 pages including English Translation.
Office Action issued in German Patent Application No. 112022001147.5 dated Oct. 27, 2025 (8 pages; with English translation).

* cited by examiner

INSULATING TRANSFORMER

CROSS-REFERENCE TO RELATED APPLICATIONS

This application is a continuation of International Application No. PCT/JP2022/015018, filed Mar. 28, 2022, which claims priority to JP 2021-055720, filed Mar. 29, 2021, the entire contents of each are incorporated herein by reference.

BACKGROUND

The present disclosure relates to an insulating transformer.

A known example of a gate driver that applies a gate voltage to the gate of a switching element such as a transistor is an insulated gate driver. JP 2018-78169 A describes an example of a semiconductor integrated circuit used as an insulated gate driver that includes a transformer. The transformer includes a first coil at the primary side and a second coil at the secondary side.

DETAILED DESCRIPTION

Figure 1:
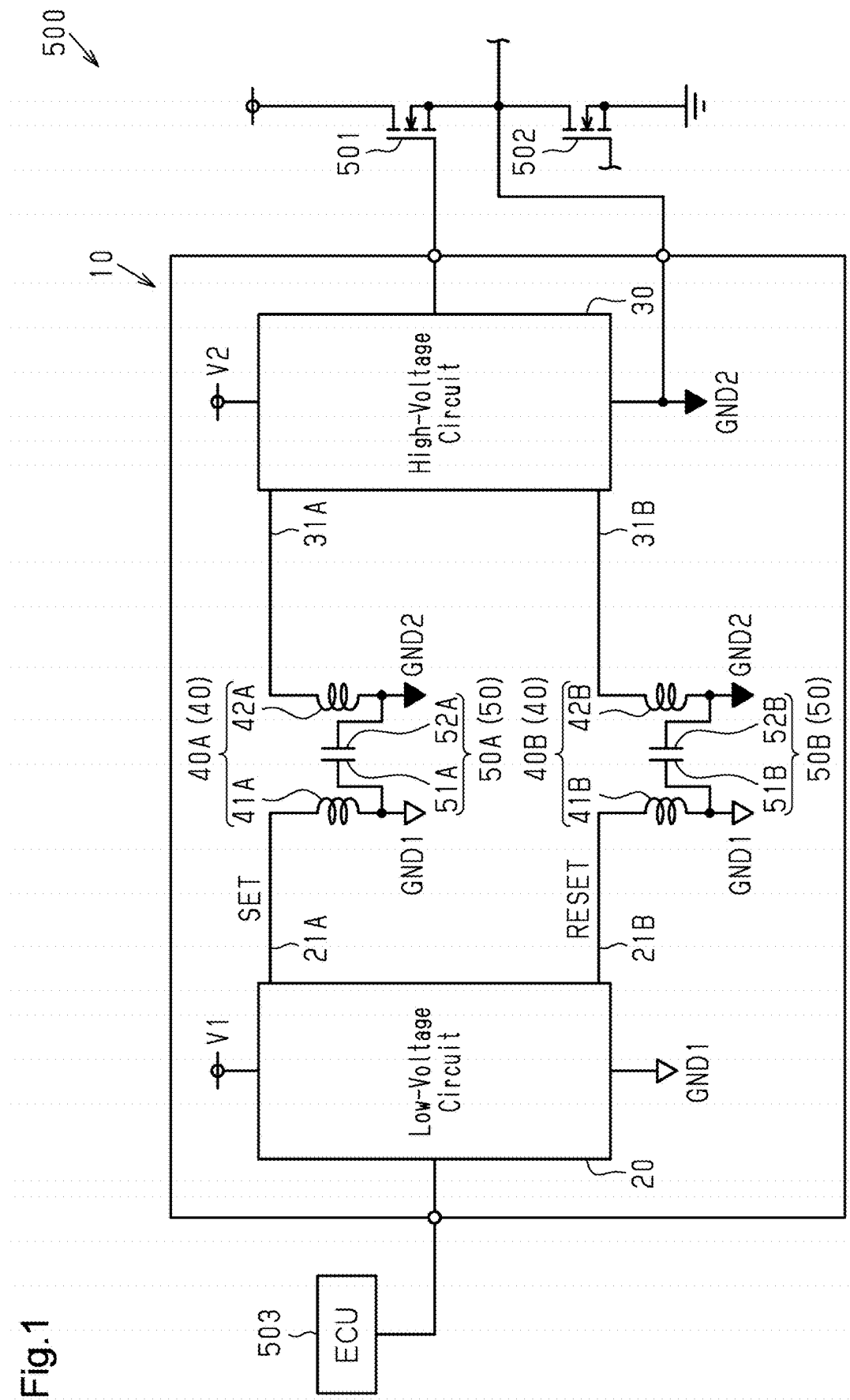
FIG. 1 is a schematic circuit diagram showing an embodiment of a gate driver.

Embodiments of a gate driver will be described below with reference to the drawings.

The embodiments described below exemplify configurations and methods for embodying a technical concept and are not intended to limit the material, shape, structure, layout, dimensions, and the like of each component to those described below. Components in the drawings may be enlarged for simplicity and clarity. The dimensional proportion of a component may not be drawn to scale or may differ between drawings. In the cross-sectional views, hatching of components may be partially omitted to facilitate understanding.

Gate Driver

An embodiment of a gate driver 10 will be described with reference to FIGS. 1 to 10.

FIG. 1 schematically shows an example of a circuit configuration of the gate driver 10. The gate driver 10 is configured to apply a drive voltage signal to the gate of a switching element. In an example, the gate driver 10 is used in an inverter device 500 mounted on an electric vehicle or a hybrid vehicle. The inverter device 500 includes two switching elements 501 and 502 connected in series to each other, the gate driver 10, and an electronic control unit 503 (ECU) that controls the gate driver 10. In an example, the switching element 501 is a high-side switching element connected to a drive power supply. The switching element 502 is a low-side switching element. Examples of the switching elements 501 and 502 include transistors such as a Si metal-oxide-semiconductor field-effect transistor (Si MOSFET), a SiC MOSFET, and an insulated gate bipolar transistor (IGBT). The gate driver 10 of the present embodiment applies a drive voltage signal to the gate of the switching element 501. In the description hereafter, SiC MOSFETs are used in the switching elements 501 and 502.

The gate driver 10 is provided for each of the switching elements 501 and 502 and separately drives the switching elements 501 and 502. In the present embodiment, the gate driver 10 that drives the switching element 501 will be described for the sake of convenience.

The gate driver 10 includes a low-voltage circuit 20 to which a first voltage V1 is applied, a high-voltage circuit 30 to which a second voltage V2 is applied, and transformers arranged between the low-voltage circuit 20 and the high-voltage circuit 30. The second voltage V2 is higher than the first voltage V1. More specifically, the low-voltage circuit 20 and the high-voltage circuit 30 are connected by the transformers 40. The first voltage V1 and the second voltage V2 are direct current voltages.

The gate driver 10 of the present embodiment is configured, based on a control signal from the ECU 503, to transmit a signal from the low-voltage circuit 20 to the high-voltage circuit 30 through the transformers 40 and to output a drive voltage signal from the high-voltage circuit 30.

The signal transmitted from the low-voltage circuit 20 toward the high-voltage circuit 30, that is, a signal output from the low-voltage circuit 20, is, for example, for driving the switching element 501. Examples of the signal include a set signal and a reset signal. The set signal transmits a rising edge of the control signal from the ECU 503. The reset signal transmits a falling edge of the control signal from the ECU 503. In other words, the set signal and the reset signal are signals for generating a drive voltage signal of the switching element 501. The set signal and the reset signal correspond to a "first signal."

More specifically, the low-voltage circuit 20 is configured to be actuated by application of the first voltage V1. The low-voltage circuit 20 is electrically connected to the ECU 503 and generates a set signal and a reset signal based on a control signal received from the ECU 503. In an example, the low-voltage circuit 20 generates the set signal in response to a rising edge of the control signal and generates the reset signal in response to a falling edge of the control signal. The low-voltage circuit 20 transmits the generated set signal and reset signal toward the high-voltage circuit 30.

The high-voltage circuit 30 is configured to be actuated by application of the second voltage V2. The high-voltage circuit 30 is electrically connected to the gate of the switching element 501. Based on the set signal and the reset signal received from the low-voltage circuit 20, the high-voltage circuit 30 generates a drive voltage signal for driving the switching element 501 and applies the drive voltage signal to the gate of the switching element 501. In other words, the high-voltage circuit 30 generates a drive voltage signal that is applied to the gate of the switching element 501 based on the first signal output from the low-voltage circuit 20. More specifically, the high-voltage circuit 30 generates a drive voltage signal for activating the switching element 501 based on the set signal and applies the drive voltage signal to the gate of the switching element 501. The high-voltage circuit 30 generates a drive voltage signal for deactivating the switching element 501 based on the reset signal and applies the drive voltage signal to the gate of the switching element 501. Thus, the gate driver 10 controls the activation and deactivation of the switching element 501.

The high-voltage circuit 30 includes, for example, an R-S flip-flop circuit, into which a set signal and a reset signal are input, and a driver unit. The driver unit generates a drive voltage signal based on an output signal of the R-S flip-flop circuit. However, the high-voltage circuit 30 may be changed to any specific circuit configuration.

In the gate driver 10 of the present embodiment, the low-voltage circuit 20 and the high-voltage circuit 30 are insulated from each other by the transformers 40. More specifically, the transformers 40 restrict transmission of a direct current voltage between the low-voltage circuit 20 and the high-voltage circuit 30 while allowing transmission of various signals such as the set signal and the reset signal.

Thus, a state in which the low-voltage circuit 20 and the high-voltage circuit 30 are insulated from each other refers to a state in which transmission of a direct current voltage between the low-voltage circuit 20 and the high-voltage circuit 30 is interrupted, while transmission of a signal between the low-voltage circuit 20 and the high-voltage circuit 30 is allowed.

The insulation voltage of the gate driver 10 is, for example, in a range of 2500 Vrms to 7500 Vrms. In the present embodiment, the insulation voltage of the gate driver 10 is approximately 5000 Vrms. However, the insulation voltage of the gate driver 10 is not limited to these values and may be any specific numerical value.

In the present embodiment, ground GND1 of the low-voltage circuit 20 and ground GND2 of the high-voltage circuit 30 are arranged independently. In the description hereafter, the potential of the ground GND1 of the low-voltage circuit 20 is referred to as a first reference potential, and the potential of the ground GND2 of the high-voltage circuit 30 is referred to as a second reference potential. In this case, the first voltage V1 is a voltage from the first reference potential, and the second voltage V2 is a voltage from the second reference potential. The first voltage V1 is, for example, in a range of 4.5 V to 5.5 V. The second voltage V2 is, for example, in a range of 9 V to 24 V.

The transformers 40 will now be described in detail.

The gate driver 10 of the present embodiment includes two transformers 40 and two capacitors 50 corresponding to two signals transmitted from the low-voltage circuit 20 toward the high-voltage circuit 30. More specifically, the gate driver 10 includes a transformer 40 and a capacitor 50 that are used to transmit a set signal (SET) and a transformer 40 and a capacitor 50 that are used to transmit a reset signal (RESET). Hereinafter, for the sake of brevity, the transformer 40 and the capacitor 50 used to transmit a set signal are referred to as a "transformer 40A" and a "capacitor 50A." The transformer 40 and the capacitor 50 used to transmit a reset signal are referred to as a "transformer 40B" and a "capacitor 50B."

The gate driver 10 includes a low-voltage signal line 21A, which connects the low-voltage circuit 20 and the transformer 40A, and a low-voltage signal line 21B, which connects the low-voltage circuit 20 and the transformer 40B. Thus, the low-voltage signal line 21A transmits the set signal from the low-voltage circuit 20 to the transformer 40A. The low-voltage signal line 21B transmits the reset signal from the low-voltage circuit 20 to the transformer 40B.

The gate driver 10 includes a high-voltage signal line 31A, which connects the transformer 40A and the high-voltage circuit 30, and a high-voltage signal line 31B, which connects the transformer 40B and the high-voltage circuit 30. Thus, the high-voltage signal line 31A transmits the set signal from the transformer 40A to the high-voltage circuit 30. The high-voltage signal line 31B transmits the reset signal from the transformer 40B to the high-voltage circuit 30.

The transformer 40A electrically insulates the low-voltage circuit 20 from the high-voltage circuit 30 while transmitting the set signal from the low-voltage circuit 20 to the high-voltage circuit 30.

The transformer 40A includes a first coil 41A and a second coil 42A. The first coil 41A and the second coil 42A are electrically insulated from each other and configured to be magnetically coupled to each other.

The first coil 41A is connected to the low-voltage circuit 20 by the low-voltage signal line 21A and is also connected to the ground GND1 of the low-voltage circuit 20. More specifically, the first coil 41A includes a first end electrically connected to the low-voltage circuit 20. The first coil 41A is configured to receive a low voltage through the first end of the first coil 41A. The first coil 41A includes a second end electrically connected to the ground GND1 of the low-voltage circuit 20. Thus, the potential of the second end of the first coil 41A equals the first reference potential. The first reference potential is, for example, 0V.

The second coil 42A is connected to the high-voltage circuit 30 by the high-voltage signal line 31A and is also connected to the ground GND2 of the high-voltage circuit 30. More specifically, the second coil 42A includes a first end electrically connected to the high-voltage circuit 30. The second coil 42A is configured to receive a high voltage through the first end of the second coil 42A. The second coil 42A includes a second end electrically connected to the ground GND2 of the high-voltage circuit 30. Thus, the potential of the second end of the second coil 42A equals the second reference potential. The ground GND2 of the high-voltage circuit 30 is connected to the source of the switching element 501. Hence, the second reference potential varies as the inverter device 500 is driven and may become, for example, greater than or equal to 600 V.

The transformer 40B electrically insulates the low-voltage circuit 20 from the high-voltage circuit 30 while transmitting the reset signal from the low-voltage circuit 20 to the high-voltage circuit 30. The transformer 40B includes a first coil 41B and a second coil 42B. The first coil 41B and the second coil 42B are electrically insulated from each other and configured to be magnetically coupled to each other. The connection configuration of the transformer 40B is the same as the connection configuration of the transformer 40A and thus will not be described in detail.

The capacitor 50A is connected to the transformer 40A. More specifically, the capacitor 50A is connected between the first coil 41A and the second coil 42A of the transformer 40A.

The capacitor 50A includes a first capacitor electrode 51A and a second capacitor electrode 52A. The first capacitor electrode 51A and the second capacitor electrode 52A are arranged between the first coil 41A and the second coil 42A of the transformer 40A. The first capacitor electrode 51A is connected to the second end of the first coil 41A. The second capacitor electrode 52A is connected to the second end of the second coil 42A. The second end of the first coil 41A is connected to the ground GND1 of the low-voltage circuit 20. Thus, the second end of the first coil 41A is a ground terminal. The first capacitor electrode 51A is connected to the ground terminal of the first coil 41A. The second end of the second coil 42A is connected to the ground GND2 of the high-voltage circuit 30. Thus, the second end of the second coil 42A is a ground terminal. Thus, the second capacitor electrode 52A is connected to the ground terminal of the second coil 42A.

The capacitor 50B is connected to the transformer 40B. More specifically, the capacitor 50B is connected between the first coil 41B and the second coil 42B of the transformer 40B.

The capacitor 50B includes a first capacitor electrode 51B and a second capacitor electrode 52B. The first capacitor electrode 51B and the second capacitor electrode 52B are arranged between the first coil 41B and the second coil 42B of the transformer 40B. The first capacitor electrode 51B is connected to a ground terminal of the first coil 41B. The second capacitor electrode 52B is connected to a ground terminal of the second coil 42B.

Figure 2:
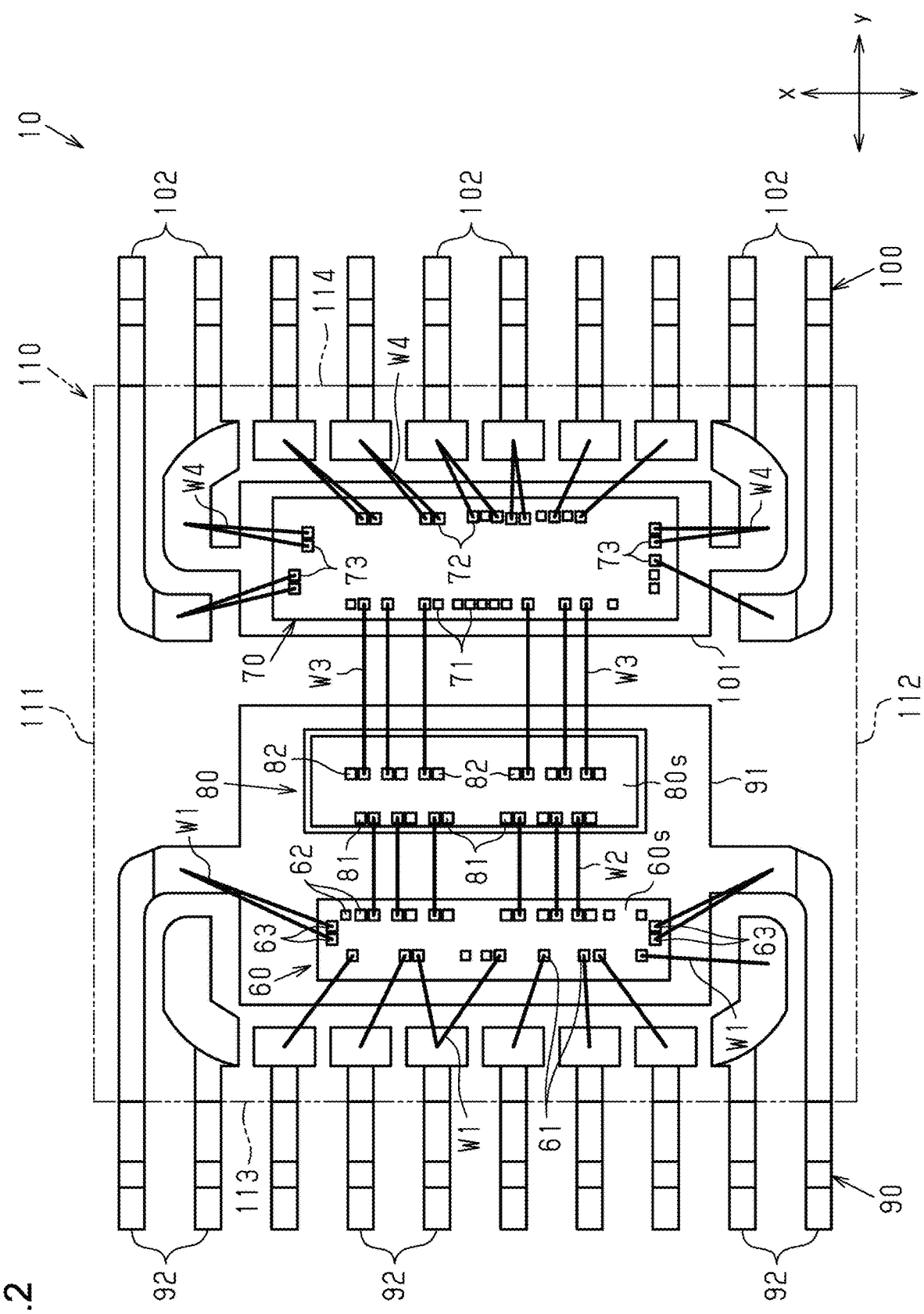
FIG. 2 is a plan view showing an internal structure of the gate driver of the embodiment.

FIG. 2 shows an example of a plan view showing the internal structure of the gate driver 10. FIG. 1 shows a simplified circuit configuration of the gate driver 10. Hence, the number of external terminals of the gate driver 10 shown in FIG. 2 is greater than the number of external terminals of the gate driver 10 shown in FIG. 1. The number of external terminals of the gate driver 10 is the number of external electrodes configured to connect the gate driver 10 to electronic components arranged outside the gate driver 10, such as the ECU 503 or the switching element 501 (refer to FIG. 1). The number of signal lines (the number of wires W1 to W4 described later) that transmit a signal from the low-voltage circuit 20 to the high-voltage circuit 30 in the gate driver 10 shown in FIG. 2 is greater than the number of signal lines in the gate driver 10 shown in FIG. 1.

As shown in FIG. 2, the gate driver 10 is a semiconductor device including multiple semiconductor chips arranged in a single package and is, for example, mounted on a circuit substrate arranged in the inverter device 500. Each of the switching elements 501 and 502 is mounted on a mount substrate that differs from the circuit substrate. A cooling unit is attached to the mount substrate.

The package type of the gate driver 10 is small outline (SO) and, in the present embodiment, is a small outline package (SOP). The gate driver 10 includes a low-voltage circuit chip 60, a high-voltage circuit chip 70, and a transformer chip 80, which are semiconductor chips. The low-voltage circuit chip 60 is mounted on a low-voltage lead frame 90. The high-voltage circuit chip 70 is mounted on a high-voltage lead frame 100. The chips 60, 70, and 80 and a portion of the lead frames 90 and 100 are encapsulated by a mold resin 110. In the present embodiment, the transformer chip 80 corresponds to an "insulating transformer." The transformer chip 80 and the mold resin 110 correspond to an "insulation module" that insulates the low-voltage circuit 20 from the high-voltage circuit 30. In FIG. 2, the mold resin 110 is indicated by double-dashed lines to illustrate the internal structure of the gate driver 10. The package type of the gate driver 10 may be changed in any manner.

The mold resin 110 is formed from an electrical insulating material. An example of the resin includes a black epoxy resin. The mold resin 110 has the form of a rectangular plate having a thickness-wise direction conforming to the z-direction. The mold resin 110 includes four resin side surfaces 111 to 114. More specifically, the mold resin 110 includes two end surfaces in the x-direction, namely, the resin side surfaces 111 and 112, and two end surfaces in the y-direction, namely, the resin side surfaces 113 and 114. The x-direction and the y-direction are orthogonal to the z-direction. The x-direction and the y-direction are orthogonal to each other. In the description hereafter, a plan view means a view in the z-direction.

The low-voltage lead frame 90 and the high-voltage lead frame 100 are each a conductor and, in the present embodiment, are formed from a material including copper (Cu), iron (Fe), or the like. The lead frames 90 and 100 extend from the inside to the outside of the mold resin 110.

The low-voltage lead frame 90 includes a low-voltage die pad 91 arranged in the mold resin 110 and low-voltage leads 92 extending from the inside to the outside of the mold resin 110. Each low-voltage lead 92 includes an external terminal configured to be electrically connected to an external electronic device such as the ECU 503 (refer to FIG. 1).

In the present embodiment, the low-voltage circuit chip 60 and the transformer chip are mounted on the low-voltage die pad 91. In plan view, the low-voltage die pad 91 is arranged so that the center of the low-voltage die pad 91 in the y-direction is located closer in the y-direction to the resin side surface 113 than the center of the mold resin 110 is. In the present embodiment, the low-voltage die pad 91 is not exposed from the mold resin 110. In plan view, the low-voltage die pad 91 is rectangular so that the long sides extend in the x-direction and the short sides extend in the y-direction.

The low-voltage leads 92 are spaced apart from each other in the x-direction. Among the low-voltage leads 92, the low-voltage leads 92 located at opposite ends in the x-direction are integrated with the low-voltage die pad 91. Each low-voltage lead 92 partially projects from the resin side surface 113 toward the outside of the mold resin 110.

The high-voltage lead frame 100 includes a high-voltage die pad 101 arranged in the mold resin 110 and high-voltage leads 102 extending from the inside to the outside of the mold resin 110. Each high-voltage lead 102 includes an external terminal configured to be electrically connected to an external electronic device such as the gate of the switching element 501 (refer to FIG. 1).

The high-voltage circuit chip 70 is mounted on the high-voltage die pad 101. In plan view, the high-voltage die pad 101 is located closer in the y-direction to the resin side surface 114 than the low-voltage die pad 91 is. In the present embodiment, the high-voltage die pad 101 is not exposed from the mold resin 110. In plan view, the high-voltage die pad 101 is rectangular so that the long sides extend in the x-direction and the short sides extend in the y-direction.

The low-voltage die pad 91 and the high-voltage die pad 101 are spaced apart from each other in the y-direction. The y-direction may also be referred to as the arrangement direction of the two die pads 91 and 101.

The dimension of the low-voltage die pad 91 and the high-voltage die pad 101 in the y-direction is set in accordance with the size and the number of semiconductor chips that are mounted. In the present embodiment, the low-voltage circuit chip 60 and the transformer chip 80 are mounted on the low-voltage die pad 91, and the high-voltage circuit chip 70 is mounted on the high-voltage die pad 101. Hence, the low-voltage die pad 91 is greater than the high-voltage die pad 101 in dimension in the y-direction.

The high-voltage leads 102 are spaced apart from each other in the x-direction. Among the high-voltage leads 102, two of the high-voltage leads 102 are integrated with the high-voltage die pad 101. Each high-voltage lead 102 partially projects from the resin side surface 114 toward the outside of the mold resin 110.

In the present embodiment, the number of the high-voltage leads 102 is the same as the number of the low-voltage leads 92. As shown in FIG. 2, the low-voltage leads 92 and the high-voltage leads 102 are arranged in a direction (x-direction) orthogonal to the arrangement direction (y-direction) of the low-voltage die pad 91 and the high-voltage die pad 101. The number of the high-voltage leads 102 and the number of the low-voltage leads 92 may be changed in any manner.

In the present embodiment, the low-voltage die pad 91 is supported by two low-voltage leads 92 that are integrated with the low-voltage die pad 91. The high-voltage die pad 101 is supported by two high-voltage leads 102 that are integrated with the high-voltage die pad 101. Hence, the die pads 91 and 101 are not provided with a suspension lead exposed from the resin side surfaces 111 and 112. This allows for an increase in the insulation distance between the low-voltage lead frame 90 and the high-voltage lead frame 100.

The low-voltage circuit chip 60, the high-voltage circuit chip 70, and the transformer chip 80 are spaced apart from each other in the y-direction. The low-voltage circuit chip 60, the transformer chip 80, and the high-voltage circuit chip 70 are arranged in this order in the y-direction from the low-voltage leads 92 toward the high-voltage leads 102.

The low-voltage circuit chip 60 includes the low-voltage circuit 20 shown in FIG. 1. In plan view, the low-voltage circuit chip 60 is rectangular and has short sides and long sides. In plan view, the low-voltage circuit chip 60 is mounted on the low-voltage die pad 91 such that the long sides extend in the x-direction and the short sides extend in the y-direction. The low-voltage circuit chip 60 includes a chip main surface 60$s$ and a chip back surface (not shown) facing opposite directions in the z-direction. The chip back surface of the low-voltage circuit chip 60 is bonded to the low-voltage die pad 91 by a conductive bonding material such as solder or silver (Ag) paste.

First electrode pads 61, second electrode pads 62, and third electrode pads 63 are formed on the chip main surface 60$s$ of the low-voltage circuit chip 60. The electrode pads 61 to 63 are electrically connected to the low-voltage circuit 20.

The first electrode pads 61 are located on the chip main surface 60$s$ between the center of the chip main surface 60$s$ in the y-direction and the low-voltage leads 92. The first electrode pads 61 are arranged in the x-direction. The second electrode pads 62 are arranged on one of the opposite ends of the chip main surface 60$s$ in the y-direction located closer to the transformer chip 80. The second electrode pads 62 are arranged in the x-direction. The third electrode pads 63 are arranged on opposite ends of the chip main surface 60$s$ in the x-direction.

The high-voltage circuit chip 70 includes the high-voltage circuit 30 shown in FIG. 1. In plan view, the high-voltage circuit chip 70 is rectangular and has short sides and long sides. In plan view, the high-voltage circuit chip 70 is mounted on the high-voltage die pad 101 such that the long sides extend in the x-direction and the short sides extend in the y-direction. The high-voltage circuit chip 70 includes a chip main surface 70$s$ and a chip back surface (not shown) facing opposite directions in the z-direction. The chip back surface of the high-voltage circuit chip 70 is bonded to the high-voltage die pad 101 by a conductive bonding material.

First electrode pads 71, second electrode pads 72, and third electrode pads 73 are formed on the chip main surface 70$s$ of the high-voltage circuit chip 70. The electrode pads 71 to 73 are electrically connected to the high-voltage circuit 30.

The first electrode pads 71 are arranged on one of the opposite ends of the chip main surface 70$s$ in the y-direction located closer to the transformer chip 80. The first electrode pads 71 are arranged in the x-direction. The second electrode pads 72 are arranged on one of the opposite ends of the chip main surface 70$s$ in the y-direction located farther away from the transformer chip 80. In other words, the second electrode pads 72 are arranged on one of the opposite ends of the chip main surface 70$s$ in the y-direction located closer to the high-voltage leads 102. The second electrode pads 72 are arranged in the x-direction. The third electrode pads 73 are arranged on opposite ends of the chip main surface 70$s$ in the x-direction.

The transformer chip 80 includes the transformers 40 (40A, 40B) and the capacitors 50 (50A, 50B), which are shown in FIG. 1. In plan view, the transformer chip 80 is rectangular and has short sides and long sides. In the present embodiment, in plan view, the transformer chip 80 is mounted on the low-voltage die pad 91 such that the long sides extend in the x-direction and the short sides extend in the y-direction.

The transformer chip 80 is arranged adjacent to the low-voltage circuit chip 60 in the y-direction. The transformer chip 80 is arranged closer to the high-voltage circuit chip 70 than the low-voltage circuit chip 60. That is, the transformer chip 80 is arranged between the low-voltage circuit chip 60 and the high-voltage circuit chip 70 in the y-direction.

The transformer chip 80 includes a chip main surface 80s and a chip back surface 80r (refer to FIG. 9) facing in opposite directions in the z-direction. The chip back surface 80r of the transformer chip 80 is bonded to the low-voltage die pad 91 by the conductive bonding material SD (refer to FIG. 9).

As shown in FIG. 2, first electrode pads 81 and second electrode pads 82 are formed on the chip main surface 80s of the transformer chip 80. In the present embodiment, each first electrode pad 81 corresponds to a "first electrode." Each second electrode pad 82 corresponds to a "second electrode."

The first electrode pads 81 are arranged, for example, on one of the opposite ends of the chip main surface 80s in the y-direction located closer to the low-voltage circuit chip 60. The first electrode pads 81 are arranged in the x-direction. The second electrode pads 82 are arranged, for example, near the center of the chip main surface 80s in the y-direction. The second electrode pads 82 are arranged in the x-direction.

Figure 4:
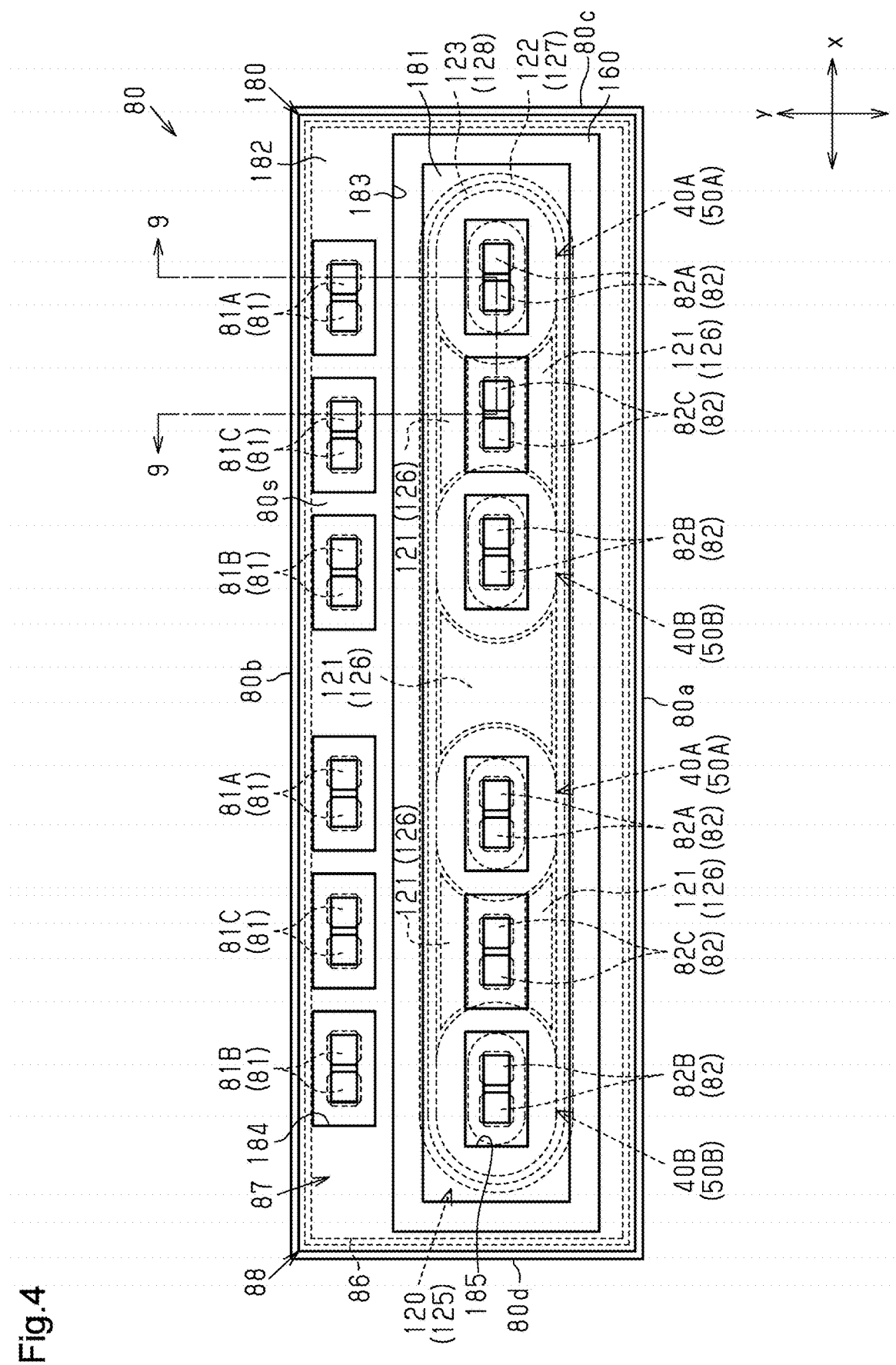
FIG. 4 is a plan view of the transformer chip shown in FIG. 3.

As shown in FIG. 4, in plan view, the transformers 40A and 40B and the capacitors 50A and 50B are arranged near the center of the chip main surface 80s in the y-direction. In plan view, the second electrode pads 82 are arranged so as not to overlap with the transformers 40A and 40B and the capacitors 50A and 50B. The electrode pads 81 and 82 are electrically connected to the transformers 40A and 40B and the capacitors 50A and 50B.

As shown in FIG. 2, the lead frames 90 and 100 are located closest to each other at the low-voltage die pad 91 and the high-voltage die pad 101. Therefore, the low-voltage die pad 91 and the high-voltage die pad 101 need to be separated from each other so that the insulation voltage of the gate driver 10 is set to a predetermined insulation voltage. Hence, in plan view, the distance between the high-voltage circuit chip 70 and the transformer chip 80 is greater than the distance between the low-voltage circuit chip 60 and the transformer chip 80.

The wires W1 to W4 are connected to each of the low-voltage circuit chip 60, the transformer chip 80, and the high-voltage circuit chip 70. Each of the wires W1 to W4 is a bonding wire formed by a wire bonder and is, for example, formed from a conductor including gold (Au), aluminum (Al), Cu, or the like.

The low-voltage circuit chip 60 is electrically connected to the low-voltage lead frame 90 by the wires W1. More specifically, the first electrode pads 61 and the third electrode pads 63 of the low-voltage circuit chip 60 are connected to the low-voltage leads 92 by the wires W1. The third electrode pads 63 of the low-voltage circuit chip 60 are connected by the wires W1 to the two low-voltage leads 92 integrated with the low-voltage die pad 91. Thus, the low-voltage circuit 20 is electrically connected to the low-voltage leads 92 (external electrodes of the gate driver 10 that are electrically connected to the ECU 503). In the present embodiment, the two low-voltage leads 92 integrated with the low-voltage die pad 91 include a ground terminal, and the low-voltage die pad 91 is electrically connected to the low-voltage circuit 20 by the wires W1. Thus, the low-voltage die pad 91 has the same potential as the ground GND1 of the low-voltage circuit 20.

The high-voltage circuit chip 70 and the high-voltage leads 102 of the high-voltage lead frame 100 are electrically connected by the wires W4. More specifically, the second electrode pads 72 and the third electrode pads 73 of the high-voltage circuit chip 70 are connected to the high-voltage leads 102 by the wires W4. Thus, the high-voltage circuit 30 is electrically connected to the high-voltage leads 102 (external electrodes of the gate driver 10 that are electrically connected to the switching element 501 or the like). In the present embodiment, the two high-voltage leads 102 integrated with the high-voltage die pad 101 include a ground terminal, and the high-voltage die pad 101 is electrically connected to the high-voltage circuit 30 by the wires W4. Thus, the high-voltage die pad 101 has the same potential as the ground GND2 of the high-voltage circuit 30.

The transformer chip 80 is connected to the low-voltage circuit chip 60 by the wires W2 and is also connected to the high-voltage circuit chip 70 by the wires W3. More specifically, the first electrode pads 81 of the transformer chip 80 and the second electrode pads 62 of the low-voltage circuit chip 60 are connected by the wires W2. More specifically, the second electrode pads 82 of the transformer chip 80 and the first electrode pads 71 of the high-voltage circuit chip 70 are connected by the wires W3.

The first coil 41A of the transformer 40A and the first coil 41B of the transformer 40B (refer to FIG. 1) are electrically connected to the ground GND1 of the low-voltage circuit 20 through the wires W2, the low-voltage circuit chip 60, and the like. The second coil 42A of the transformer 40A and the second coil 42B of the transformer 40B (refer to FIG. 1) is electrically connected to the ground GND2 of the high-voltage circuit 30 through the wires W3, the high-voltage circuit chip 70, and the like.

Structure of Transformer Chip

An example of the structure of the transformer chip 80 will now be described with reference to FIGS. 3 to 10.

In the following description, a direction from the chip back surface 80r of the transformer chip 80 toward the chip main surface 80s is referred to as an upward direction, and a direction from the chip main surface 80s toward the chip back surface 80r is referred to as a downward direction.

Figure 3:
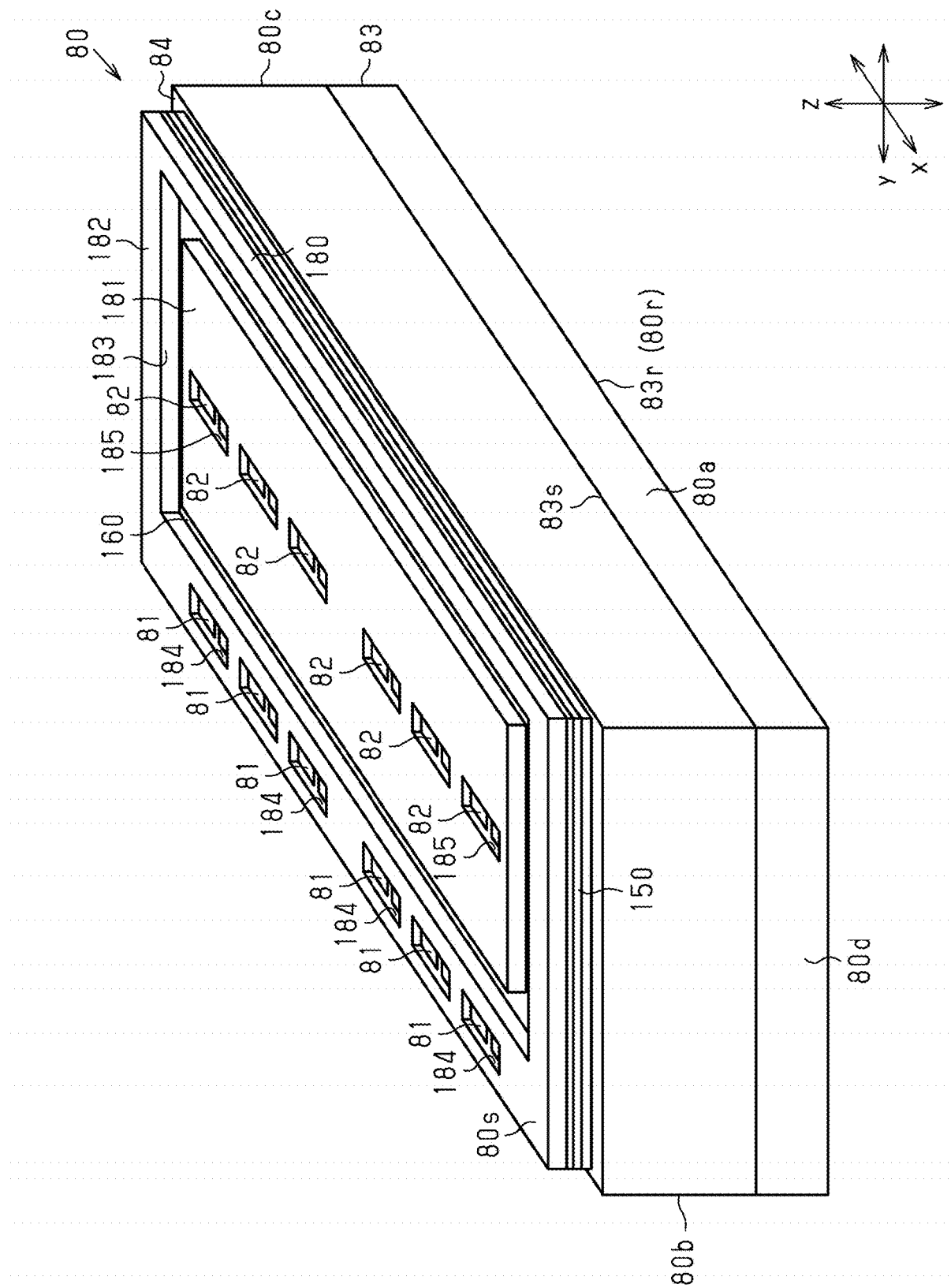
FIG. 3 is a perspective view showing a transformer chip included in the gate driver of the embodiment.

FIG. 3 is a perspective view showing the outer appearance of the transformer chip 80.

FIG. 4 is a plan view of the transformer chip 80. The transformers 40A and 40B, the capacitors 50A and 50B, a shield electrode 86, and dummy patterns 120 and 125, which will be described later, are indicated by broken lines for the sake of illustration.

Figure 5:
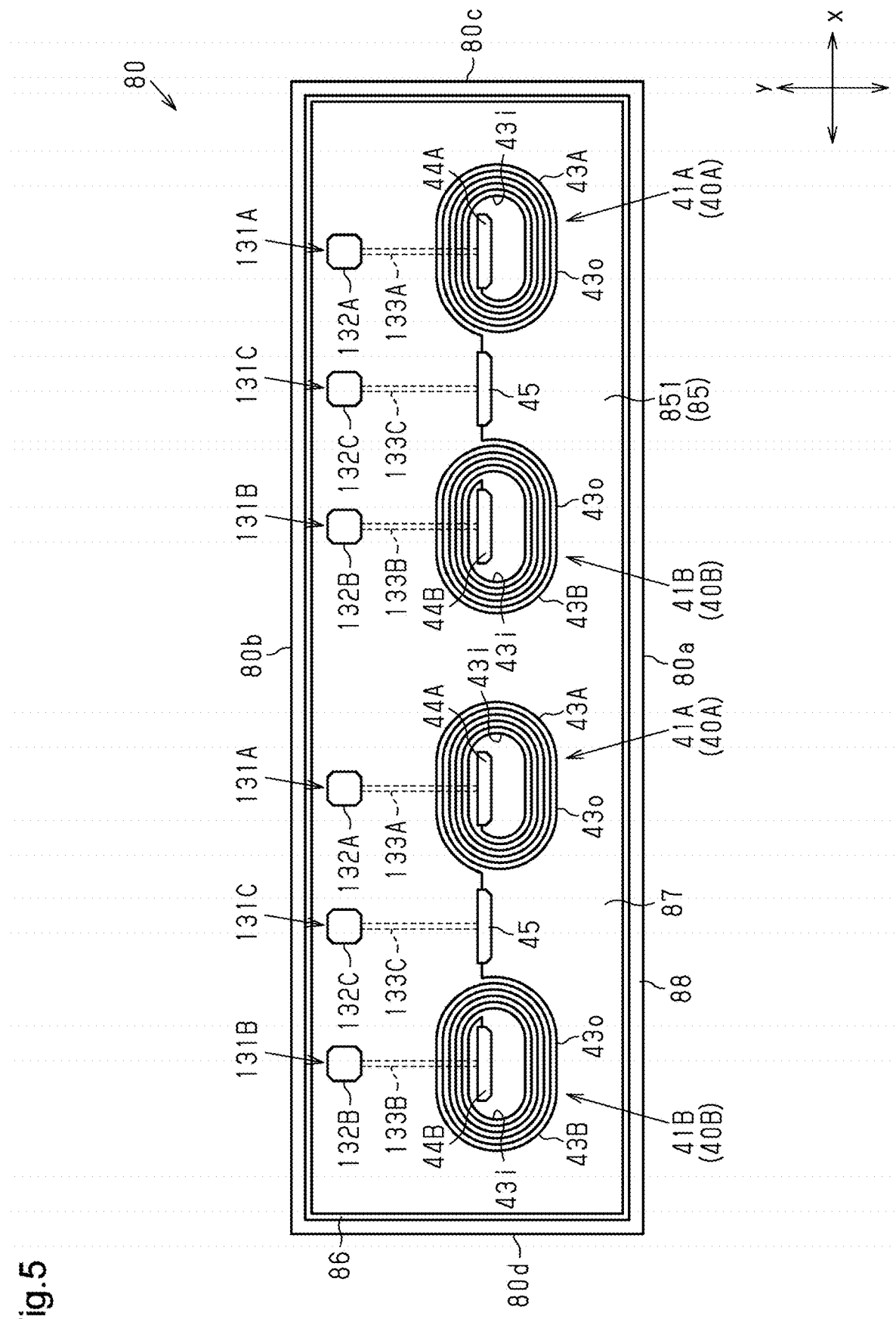
FIG. 5 is a schematic cross-sectional view showing a first coil of the transformer chip shown in FIG. 3.
Figure 6:
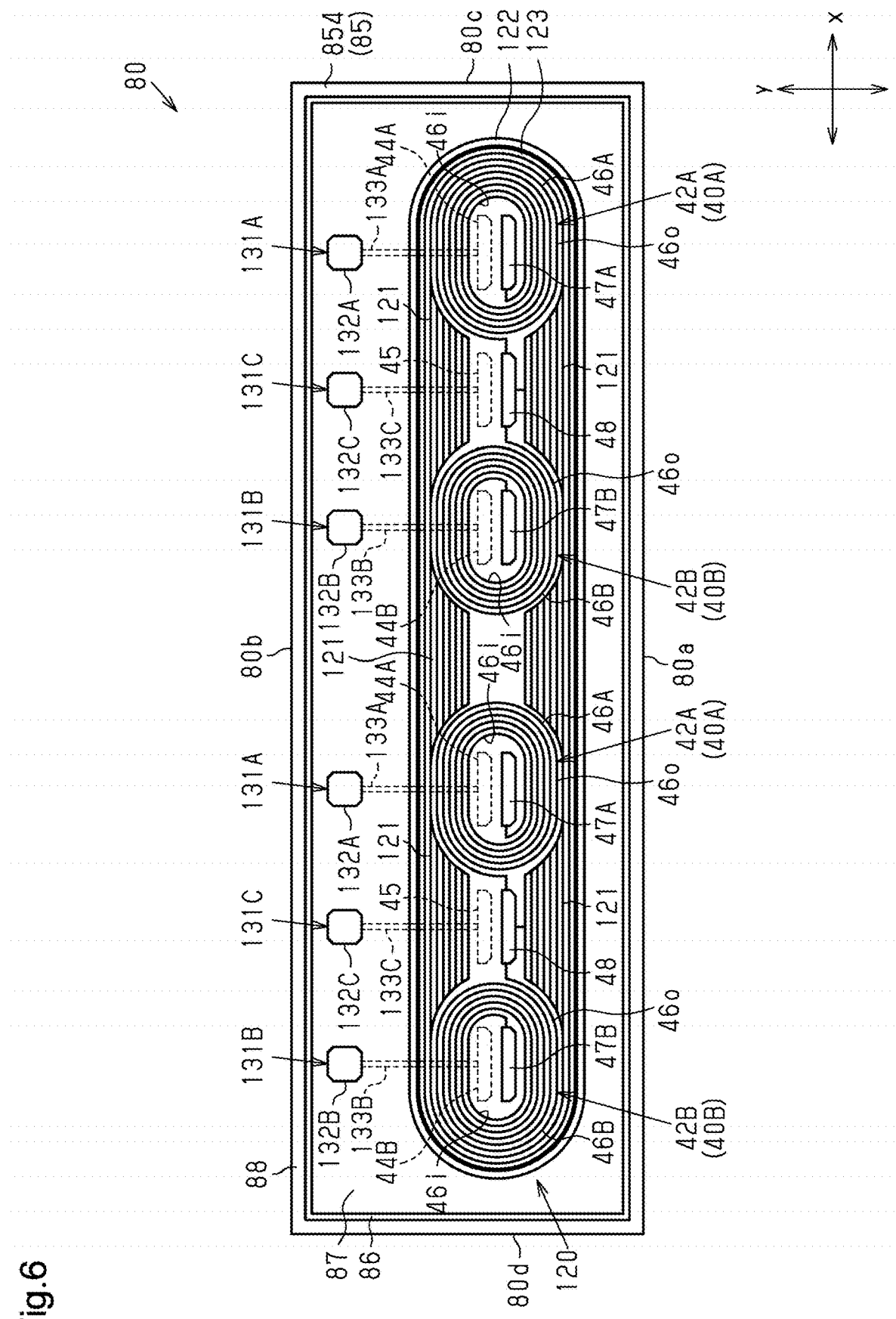
FIG. 6 is a schematic cross-sectional view showing a second coil of the transformer chip shown in FIG. 3.

FIG. 5 is a cross-sectional view of the transformer chip 80 that is cut along an xy-plane through a position of the first coils 41A and 41B in the z-direction showing the connection relationship of the first coils 41A and 41B. FIG. 6 is a cross-sectional view of the transformer chip 80 that is cut along an xy-plane through a position of the second coils 42A and 42B in the z-direction showing the connection relationship of the second coils 42A and 42B. FIGS. 5 and 6 do not show hatching for the sake of convenience.

Figure 7:
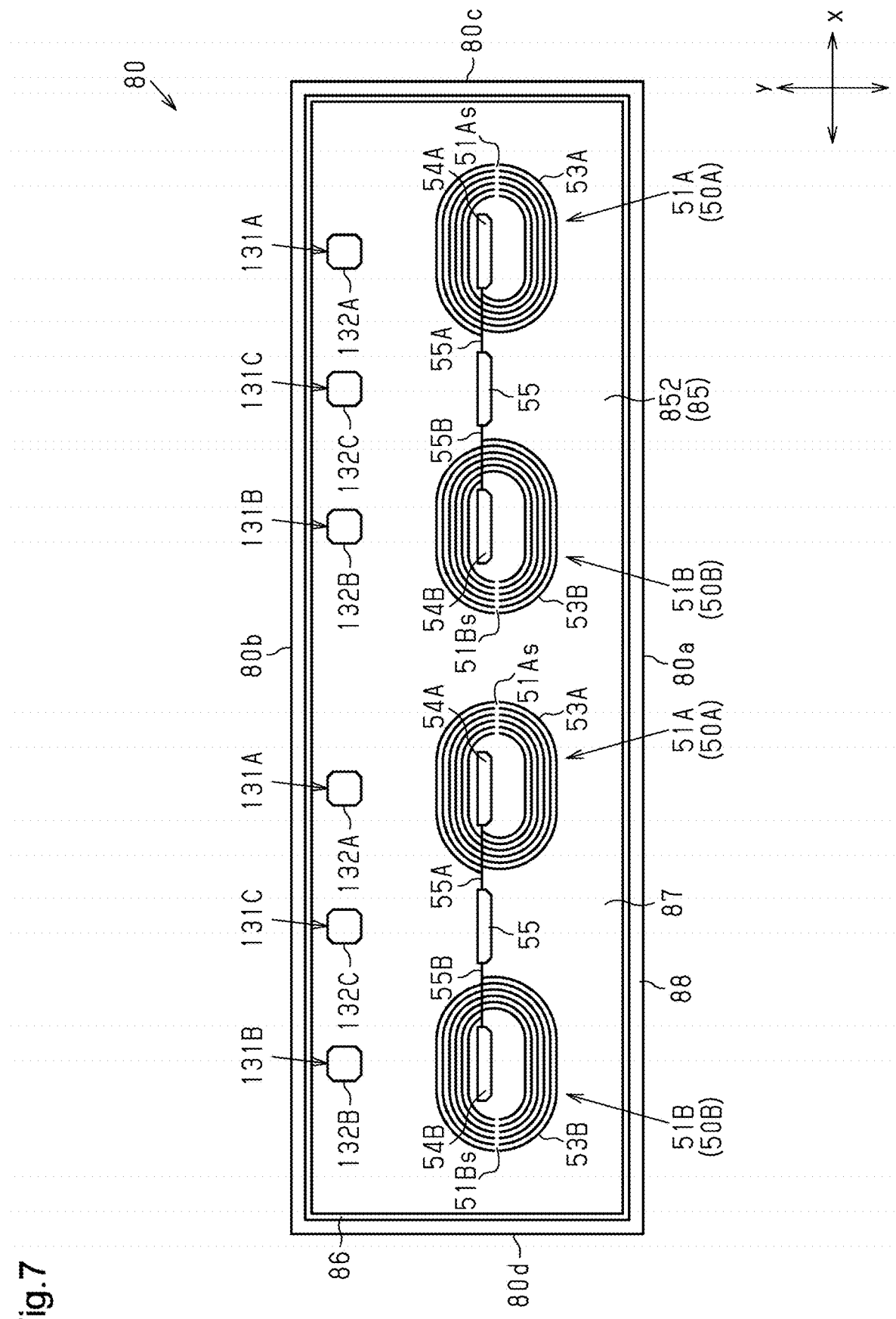
FIG. 7 is a schematic cross-sectional view showing a first capacitor electrode of the transformer chip shown in FIG. 3.
Figure 8:
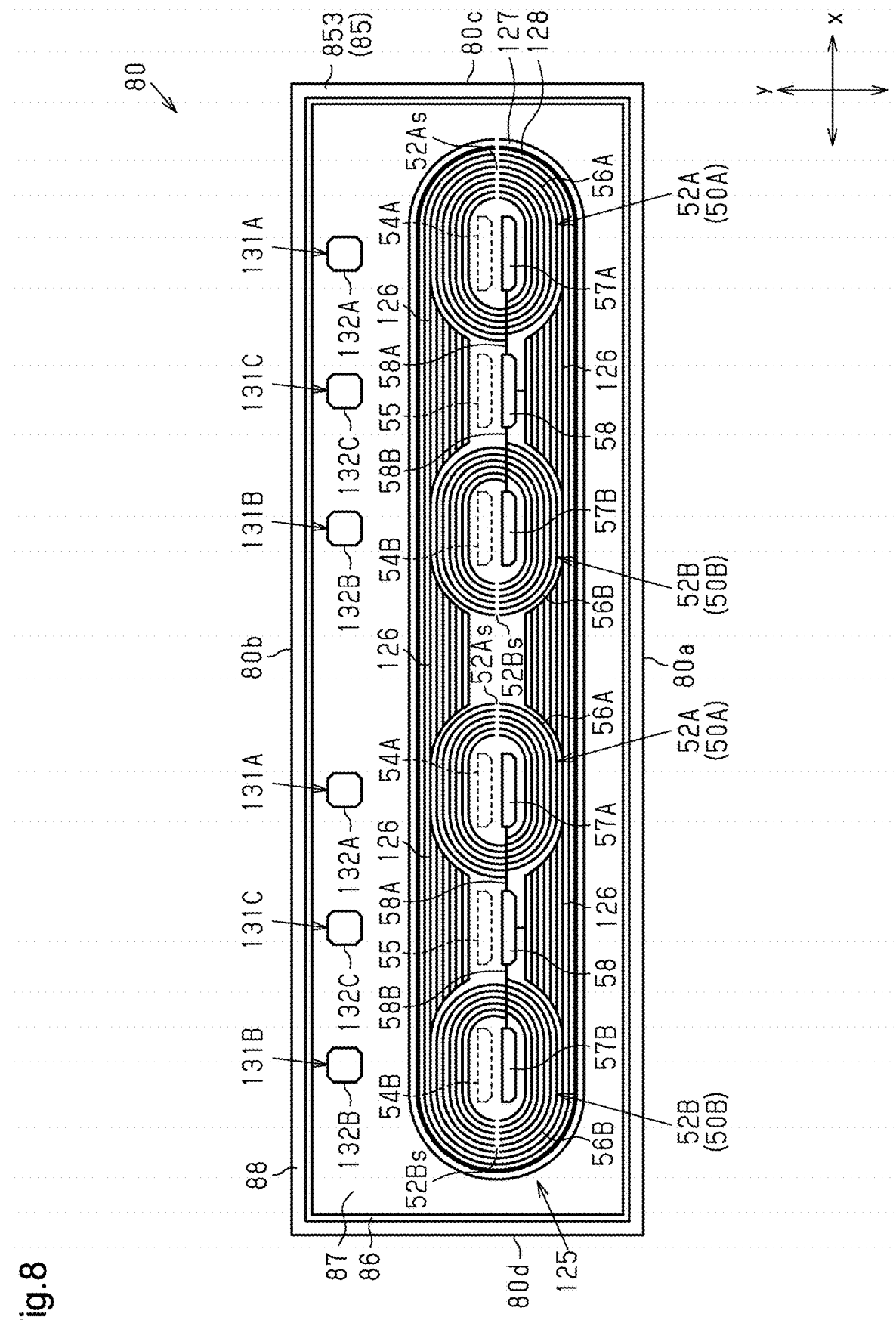
FIG. 8 is a schematic cross-sectional view showing a second capacitor electrode of the transformer chip shown in FIG. 3.

FIG. 7 is a cross-sectional view of the transformer chip 80 that is cut along an xy-plane through a position of the first capacitor electrodes 51A and 51B in the z-direction. FIG. 8 is a cross-sectional view of the transformer chip 80 that is cut along an xy-plane through a position of the second capacitor electrodes 52A and 52B in the z-direction. FIGS. 7 and 8 do not show hatching for the sake of convenience.

Figure 9:
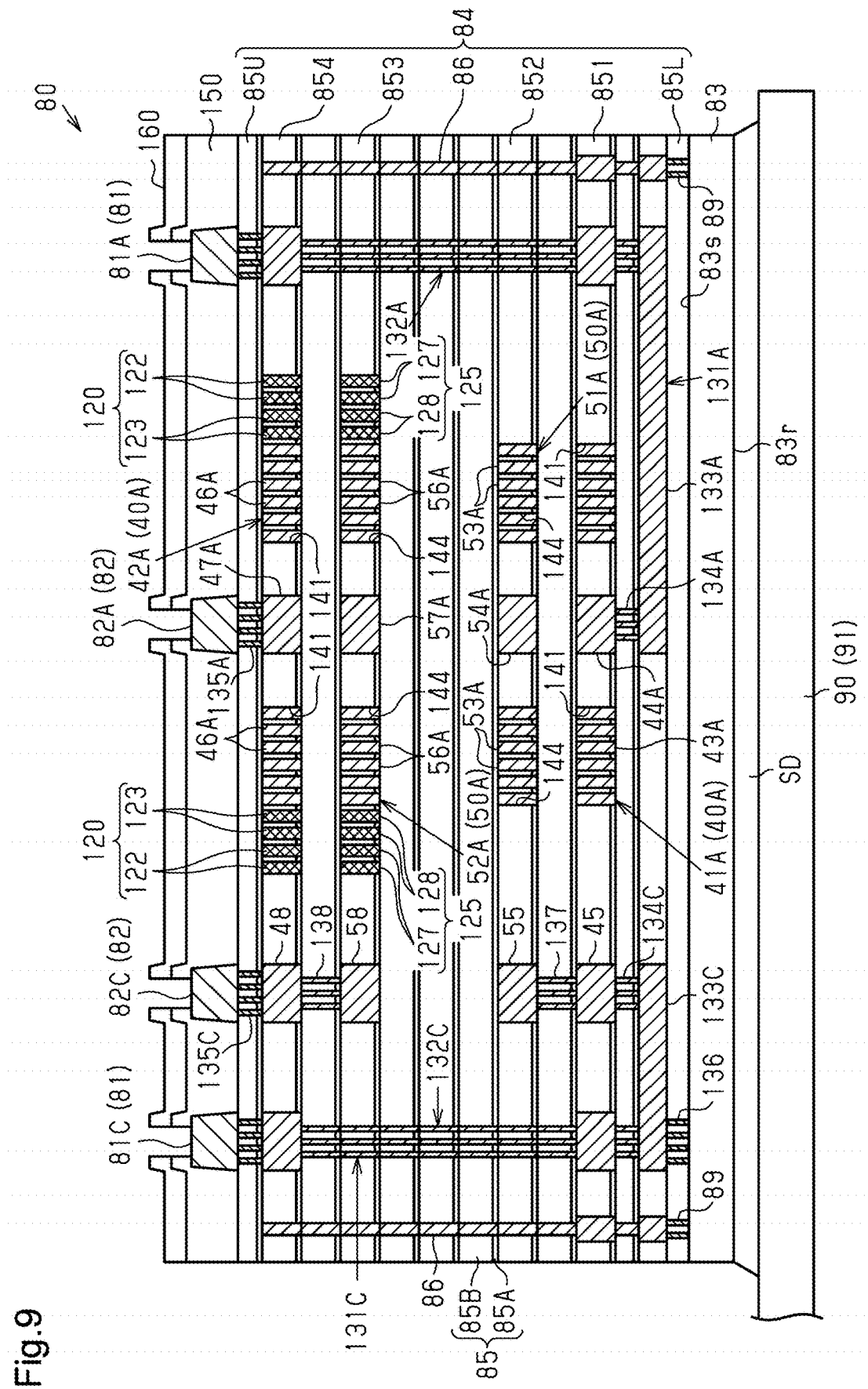
FIG. 9 is a cross-sectional view of the transformer chip mounted on a low-voltage die pad taken along line 9-9 in FIG. 4.
Figure 10:
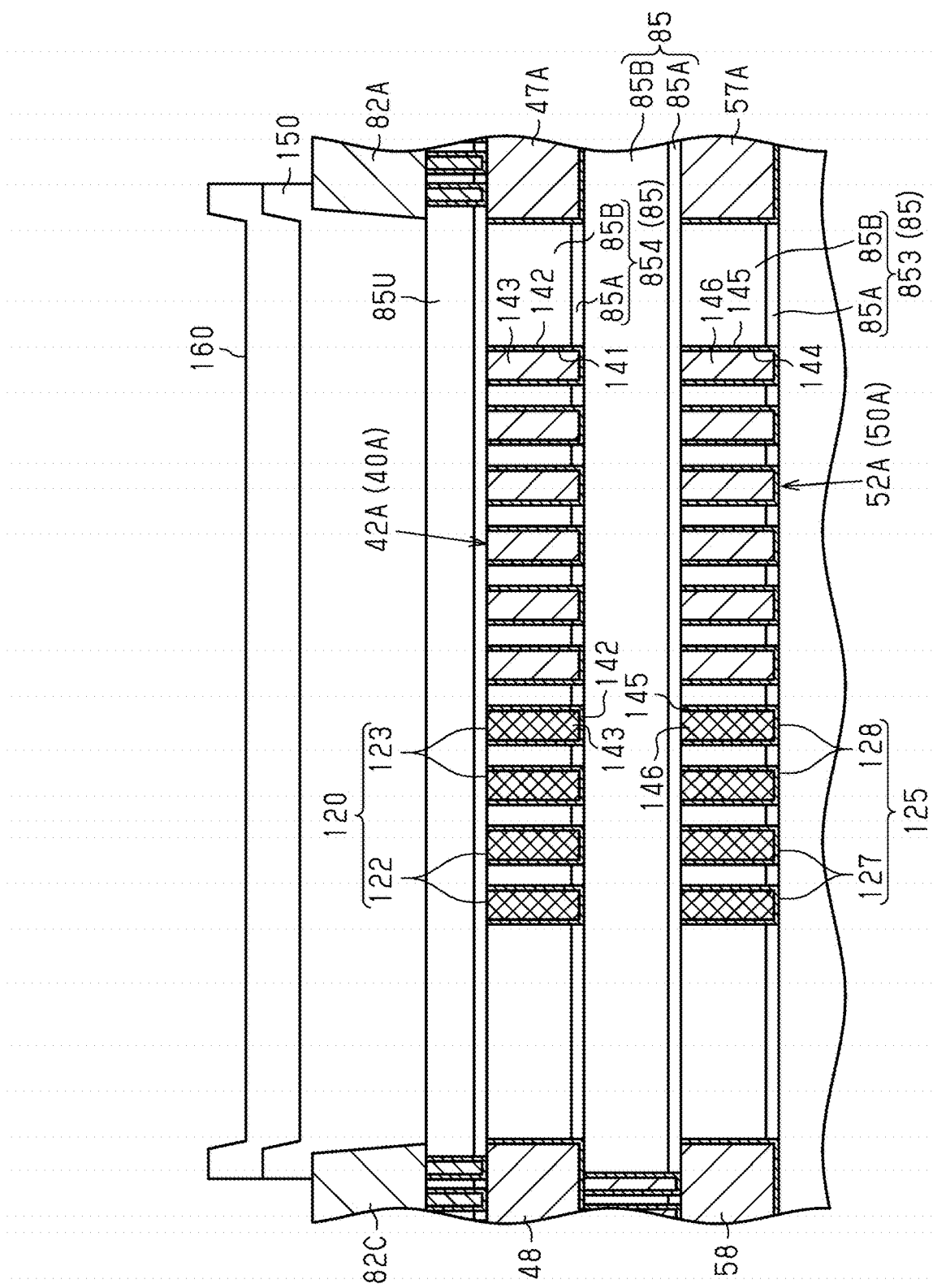
FIG. 10 is an enlarged view showing a portion of the transformer chip shown in FIG. 9.

FIG. 9 is a cross-sectional view of the transformer chip 80 taken along line 9-9 in FIG. 4 showing a cross-sectional structure of the transformer 40A and the capacitor. FIG. 9 partially does not show hatching for simplicity and clarity. FIG. 10 is an enlarged view showing a portion of FIG. 9 and partially does not show hatching in the same manner as FIG. 9.

As shown in FIG. 4, the transformer chip 80 of the present embodiment includes two sets of the transformers 40A and 40B and the capacitors 50A and 50B. More specifically, the transformer chip 80 is a semiconductor chip that includes the transformers 40A and 40B and the capacitors 50A and 50B in the single chip. Thus, the transformer chip 80 is arranged separately from the low-voltage circuit chip 60 and the high-voltage circuit chip 70 (refer to FIG. 2).

The two sets of the transformers 40A and 40B and the capacitors 50A and 50B have the same structure. Furthermore, the transformer 40B and the transformer 40A have the same structure. The capacitor 50B and the capacitor 50A have the same structure. The structures of the transformer 40A and the capacitor 50A will be described in detail. The structures of the transformer 40B and the capacitor 50B will not be described in detail.

As shown in FIG. 4, the transformer chip 80 includes four chip side surfaces 80a, 80b, 80c, and 80d that are orthogonal to the chip main surface 80s and the chip back surface 80r. The chip side surfaces 80a to 80d are arranged between the chip main surface 80s and the chip back surface 80r in the z-direction. The chip side surfaces 80a and 80b define opposite surfaces of the transformer chip 80 in the y-direction. The chip side surfaces 80c and 80d define opposite surfaces of the transformer chip 80 in the x-direction. In plan view, the chip side surfaces 80a and 80b define long sides of the transformer chip 80. The chip side surfaces 80c and 80d define short sides of the transformer chip 80. In the present embodiment, the chip side surface 80a is located closer to the high-voltage circuit chip 70 (refer to FIG. 2) than the chip side surface 80b is. The chip side surface 80b is located closer to the low-voltage circuit chip 60 (refer to FIG. 2) than the chip side surface 80a is.

As shown in FIGS. 4 and 9, the transformer chip 80 includes a substrate 83 and an insulation layer 84 formed on the substrate 83.

The substrate 83 is composed of, for example, a semiconductor substrate. In the present embodiment, the substrate 83 is formed from a material including silicon (Si). As the semiconductor substrate, a wide-bandgap semiconductor or a compound semiconductor may be used for the substrate 83. Alternatively, instead of the semiconductor substrate, an insulating substrate formed from a glass-containing material may be used for the substrate 83.

The wide-bandgap semiconductor is a semiconductor substrate having a band gap that is greater than or equal to 2.0 eV. The wide-bandgap semiconductor may be silicon carbide (SiC). The compound semiconductor may be a group III-V compound semiconductor. The compound semiconductor may include at least one of aluminum nitride (AlN), indium nitride (InN), gallium nitride (GaN), and gallium arsenide (GaAs).

The substrate 83 includes a substrate main surface 83s and a substrate back surface 83r facing opposite directions in the z-direction. The substrate back surface 83r defines the chip back surface 80r of the transformer chip 80.

As shown in FIG. 9, the insulation layer 84 of the present embodiment includes insulation films 85 stacked on the substrate main surface 83s of the substrate 83 in the z-direction. Thus, the z-direction may be referred to as a thickness-wise direction of the insulation layer 84. Also, the z-direction may be referred to as a thickness-wise direction of the insulation films 85. The insulation layer 84 is formed on the substrate main surface 83s of the substrate 83.

Each insulation film 85 includes a first insulation film 85A and a second insulation film 85B formed on the first insulation film 85A. The first insulation film 85A is a thin film and is, for example, an etching stopper layer. The first insulation film 85A is formed from a material including silicon nitride (SiN), SiC, nitrogen-added silicon carbide (SiCN), or the like. In the present embodiment, the first insulation film 85A is formed from a material including SiN. The second insulation film 85B is, for example, an interlayer insulation film. The second insulation film 85B is formed from a material including silicon oxide ($SiO_2$). As shown in FIG. 9, the second insulation film 85B is greater in thickness than the first insulation film 85A. The thickness of the first insulation film 85A may be in a range of 100 nm to 1000 nm. The thickness of the second insulation film 85B may be in a range of 1000 nm to 3000 nm. In the present embodiment, the thickness of the first insulation film 85A is, for example, approximately 300 nm, and the thickness of the second insulation film 85B is, for example, approximately 2000 nm.

The second insulation films 85B include a lowermost insulation film 85L, which is in contact with the substrate main surface 83s of the substrate 83, and an uppermost insulation film 85U. Thus, each of the lowermost insulation film 85L and the uppermost insulation film 85U is smaller in thickness than other insulation films 85. The thickness of each of the lowermost insulation film 85L and the uppermost insulation film 85U is in a range of the thickness of the first insulation film 85A to the thickness of the second insulation film 85B.

The thicknesses of the lowermost insulation film 85L and the uppermost insulation film 85U may be changed in any manner. In an example, the thickness of each of the lowermost insulation film 85L and the uppermost insulation film 85U may be greater than the thickness of the second insulation film 85B or may be greater than or equal to the thickness of an insulation film 85 that includes the first insulation film 85A and the second insulation film 85B.

The transformer chip 80 includes the shield electrode 86 formed in the insulation layer 84. The shield electrode 86 limits entrance of moisture into the insulation layer 84 and formation of cracks in the insulation layer 84. In plan view, the shield electrode 86 is arranged on a peripheral portion of the insulation layer 84 (peripheral portion of the transformer chip 80). More specifically, as shown in FIGS. 4 to 8, the shield electrode 86 is spaced apart from the chip side surfaces 80a to 80d. In plan view, the shield electrode 86 is strip-shaped and extends along the chip side surfaces 80a to 80d. In the present embodiment, the shield electrode 86 has the form of a rectangular loop in plan view. The shield electrode 86 divides the insulation layer 84 into an inner region 87 and an outer region 88. In the present embodiment, as shown in FIG. 9, the uppermost insulation film 85U extends across the shield electrode 86 in plan view. That is, the uppermost insulation film 85U includes the outer region 88.

As shown in FIG. 4, the inner region 87 is a region of the insulation layer 84 protected by the shield electrode 86. In plan view, the inner region 87 is rectangular so that the long sides extend in the x-direction and the short sides extend in the y-direction. The outer region 88 is a rectangular loop region surrounding the inner region 87 in plan view. The outer region 88 is located between the shield electrode 86 and each of the chip side surfaces 80a to 80d in plan view. Thus, the outer region 88 is a rectangular loop region including the chip side surfaces 80a to 80d.

As shown in FIG. 9, the shield electrode 86 extends through the insulation films 85 in the z-direction. More specifically, as viewed in a direction orthogonal to the z-direction, the shield electrode 86 is arranged to overlap the coils 41A, 41B, 42A, and 42B of the transformers 40A and 40B and the capacitor electrodes 51A, 51B, 52A, and 52B of the capacitors 50A and 50B. In the present embodiment, the shield electrode 86 extends in the z-direction from the insulation film 85 that is located immediately below the uppermost insulation film 85U to the insulation film 85 that is located immediately above the lowermost insulation film 85L. The shield electrode 86 is formed from a material including one or more selected from titanium (Ti), titanium nitride (TiN), Au, Ag, Cu, Al, and tungsten (W).

The lowermost insulation film 85L includes vias 89 extending through the lowermost insulation film 85L in the z-direction. The vias 89 are arranged to overlap the shield electrode 86 in plan view and connect the shield electrode 86 to the substrate 83. Thus, the shield electrode 86 is electrically connected to the substrate 83. In an example, the vias 89 and the shield electrode 86 may be formed from the same material.

As shown in FIG. 4, the transformers 40A and 40B and the capacitors 50A and 50B are embedded in the insulation layer 84. The transformers 40A and 40B and the capacitors 50A and 50B are arranged in the inner region 87. As viewed in the z-direction, the capacitor 50A overlaps the transformer 40A, and the capacitor 50B overlaps the transformer 40B. The transformers 40A and 40B and the capacitors 50A and 50B are aligned with each other in the y-direction and spaced apart from each other in the x-direction. In other words, the transformers 40A and 40B and the capacitors 50A and 50B are arranged in a direction orthogonal to a direction in which the chips 60, 70, and 80 are arranged.

As shown in FIG. 4, the transformer 40A and the capacitor 50A alternate with the transformer 40B and the capacitor 50B in the x-direction from the chip side surface 80c toward the chip side surface 80d.

As shown in FIG. 5, the first coil 41A of the transformer 40A includes a first coil wiring 43A, a first ground terminal 45 connected to one end of the first coil wiring 43A, and a first signal terminal 44A connected to the other end of the first coil wiring 43A. The first coil 41B of the transformer 40B includes a first coil wiring 43B, a first ground terminal 45 connected to one end of the first coil wiring 43B, and a first signal terminal 44B connected to the other end of the first coil wiring 43B. The first ground terminal 45 is configured to be a common terminal to the first coil 41A and the first coil 41B. Alternatively, the first coil 41A and the first coil 41B may be provided with separate first ground terminals.

The first coil wirings 43A and 43B are elliptical and spiral in plan view. The first signal terminals 44A and 44B are arranged at an inner side of the first coil wirings 43A and 43B. The first ground terminal 45 is arranged between the first coil 41A of the transformer 40A and the first coil 41B of the transformer 40B. The first coils 41A and 41B are formed from a material including one or more selected from Ti, TiN, Au, Ag, Cu, Al, and W.

The first signal terminal 44A is connected by an interconnect 131A to a first electrode pad 81A, shown in FIG. 4. The first signal terminal 44B is connected by an interconnect 131B to a first electrode pad 81B, shown in FIG. 4. The first ground terminal 45 is connected by an interconnect 131C to a first electrode pad 81C, shown in FIG. 4.

As shown in FIG. 6, the second coil 42A of the transformer 40A includes a second coil wiring 46A, a second ground terminal 48 connected to one end of the second coil wiring 46A, and a second signal terminal 47A connected to the other of the second coil wiring 46A. The second coil 42B of the transformer 40B includes a second coil wiring 46B, a second ground terminal 48 connected to one end of the second coil wiring 46B, and a second signal terminal 47B connected to the other end of the second coil wiring 46B. The second ground terminal 48 is configured to be a common terminal to the second coil 42A and the second coil 42B. Alternatively, the second coil 42A and the second coil 42B may be provided with separate second ground terminals.

The second coil wirings 46A and 46B are elliptical and spiral in plan view. The second signal terminals 47A and 47B are arranged at an inner side of the second coil wirings 46A and 46B. The second ground terminal 48 is arranged between the second coil 42A of the transformer 40A and the second coil 42B of the transformer 40B. The second coils 42A and 42B are formed from a material including one or more selected from Ti, TiN, Au, Ag, Cu, Al, and W.

The second signal terminal 47A is connected to a second electrode pad 82A, shown in FIG. 4. The second signal terminal 47B is connected to a second electrode pad 82B, shown in FIG. 4. The second ground terminal 48 is connected to a second electrode pad 82C, shown in FIG. 4.

In the present embodiment, the second coil wiring 46A is formed in the same winding direction as the first coil wiring 43A, shown in FIG. 5. The second coil wiring 46A and the first coil wiring 43A are wound the same number of times. In the present embodiment, the second coil wiring 46B is formed in the same winding direction as the first coil wiring 43B, shown in FIG. 5. The second coil wiring 46B and the first coil wiring 43B are wound the same number of times.

As shown in FIG. 9, the first coil 41A and the second coil 42A of the transformer are opposed to each other in the z-direction with an insulation film 85 interposed. In the present embodiment, the first coil 41A and the second coil 42A are opposed to each other in the z-direction with multiple insulation films 85 interposed.

The first coil 41A is configured to be a conductive layer embedded in one insulation film 85. More specifically, the first coil 41A is embedded in an insulation film 851. The insulation film 851 includes a coil groove 141 (first coil groove) extending through the first insulation film 85A and the second insulation film 85B in the z-direction. The conductive layer forming the first coil 41A is embedded in the coil groove 141 of the insulation film 851. The insulation film 851, in which the first coil 41A is embedded, is covered by insulation films 85 located next to the insulation film 851 in the z-direction. Thus, the first coil 41A is embedded in the insulation films 85.

The second coil 42A is configured to be a conductive layer embedded in one insulation film 85. More specifically, the second coil 42A is embedded in an insulation film 854. The insulation film 854 includes a coil groove 141 (second coil groove) extending through the first insulation film 85A and the second insulation film 85B in the z-direction. The conductive layer forming the second coil 42A is embedded in the coil groove 141 of the insulation film 854. The insulation film 854, in which the second coil 42A is embedded, is covered by insulation films 85 located next to the insulation film 854 in the z-direction. Thus, the second coil 42A is embedded in the insulation films 85.

In the z-direction, the second coil 42A is located farther away from the substrate 83 than the first coil 41A is. In other words, the second coil 42A is located above the first coil 41A. Also, in other words, the first coil 41A is located closer to the substrate 83 than the second coil 42A is. In the present embodiment, the distance between the first coil 41A and the second coil 42A in the z-direction is greater than the distance between the first coil 41A and the substrate main surface 83s of the substrate 83.

In plan view, the first capacitor electrode 51A of the capacitor 50A, shown in FIG. 7, overlaps the first coil 41A, shown in FIG. 5. The first capacitor electrode 51A is formed from a conductive material. More preferably, the first capacitor electrode 51A is formed from a nonmagnetic material. As the nonmagnetic material, one or more is selected from Ti, TiN, tungsten titanium (TiW), tantalum (Ta), (tantalum nitride) TaN, chromium (Cr), chromium silicide (CrSi), Au, Ag, Cu, Al, and W. Alternatively, the first capacitor electrode 51A may be formed of a conductive material other than the materials described above.

The first capacitor electrode 51A includes a first electrode wiring 53A, a first capacitor end 54A, and a first capacitor ground terminal 55. The first electrode wiring 53A is elliptical and spiral in the same manner as the first coil wiring 43A, shown in FIG. 5. The first electrode wiring 53A is identical in shape to the first coil wiring 43A of the first coil 41A, shown in FIG. 5. That is, the first electrode wiring 53A is set to be equal to the first coil wiring 43A in ratio of wiring width to wiring spacing.

The first electrode wiring 53A includes a first slit 51As extending from the center of the first electrode wiring 53A toward an outer side of the first electrode wiring 53A. The first electrode wiring 53A is annular and is open by the first slit 51As. The first slit 51As limits formation of a current loop in the first electrode wiring 53A.

The first capacitor end 54A overlaps the first signal terminal 44A of the first coil 41A, shown in FIG. 5. In plan view, the first capacitor end 54A is identical in shape to the first signal terminal 44A. The first capacitor end 54A is arranged at an inner side of the first electrode wiring 53A and is connected to the first electrode wiring 53A. The shape of the first capacitor end 54A may be changed in any manner. Moreover, the first capacitor end 54A may be omitted.

The first capacitor ground terminal 55 overlaps the first ground terminal 45 of the first coil 41A, shown in FIG. 5. In plan view, the first capacitor ground terminal 55 is identical in shape to the first ground terminal 45. The first capacitor ground terminal 55 is arranged between the first capacitor electrode 51A of the capacitor 50A and the first capacitor electrode 51B of the capacitor 50B. The first capacitor ground terminal 55 is electrically connected to each interconnect part of the first electrode wiring 53A by an interconnect 55A extending toward the center of the first electrode wiring 53A.

In plan view, the first capacitor electrode 51B of the capacitor 50B, shown in FIG. 7, overlaps the first coil 41B, shown in FIG. 5. The first capacitor electrode 51B is formed from a conductive material. More preferably, the first capacitor electrode 51B is formed from a nonmagnetic material. As the nonmagnetic material, one or more is selected from Ti, TiN, TiW, Ta, TaN, Cr, CrSi, Au, Ag, Cu, Al, and W. Alternatively, the first capacitor electrode 51B may be formed of a conductive material other than the materials described above.

The first capacitor electrode 51B includes a first electrode wiring 53B, a first capacitor end 54B, and a first capacitor ground terminal 55. Thus, the first capacitor electrodes 51A and 51B include the first capacitor ground terminal 55 as a common terminal in the same manner as the first coils 41A and 41B, shown in FIG. 5.

The first electrode wiring 53B is elliptical and spiral in the same manner as the first coil wiring 43B, shown in FIG. 5. The first electrode wiring 53B is identical in shape to the first coil wiring 43B of the first coil 41B, shown in FIG. 5. That is, the first electrode wiring 53B is set to be equal to the first coil wiring 43B in ratio of wiring width to wiring spacing. The first electrode wiring 53B includes a first slit 51Bs extending from the center of the first electrode wiring 53B toward an outer side of the first electrode wiring 53B. The first electrode wiring 53B is annular and is open by the first slit 51Bs. The first slit 51Bs limits formation of a current loop in the first electrode wiring 53B.

The first capacitor end 54B overlaps the first signal terminal 44B of the first coil 41B, shown in FIG. 5. In plan view, the first capacitor end 54B is identical in shape to the first signal terminal 44B. The first capacitor end 54B is arranged at an inner side of the first electrode wiring 53B and is connected to the first electrode wiring 53B. The shape of the first capacitor end 54B may be changed in any manner. Moreover, the first capacitor end 54B may be omitted.

The first capacitor ground terminal 55 is electrically connected to each interconnect part of the first electrode wiring 53B by an interconnect 55B extending toward the center of the first electrode wiring 53B.

In plan view, the second capacitor electrode 52A of the capacitor 50A, shown in FIG. 8, overlaps the second coil 42A, shown in FIG. 6. The second capacitor electrode 52A is formed from a conductive material. More preferably, the second capacitor electrode 52A is formed from a nonmagnetic material. As the nonmagnetic material, one or more is selected from Ti, TiN, TiW, Ta, TaN, Cr, CrSi, Au, Ag, Cu, Al, and W. Alternatively, the second capacitor electrode 52A may be formed of a conductive material other than the materials described above.

The second capacitor electrode 52A includes a second electrode wiring 56A, a second capacitor end 57A, and a second capacitor ground terminal 58. The second electrode wiring 56A is elliptical and spiral in the same manner as the second coil wiring 46A, shown in FIG. 6. The second electrode wiring 56A is identical in shape to the second coil wiring 46A of the second coil 42A, shown in FIG. 6. That is, the second electrode wiring 56A is set to be equal to the second coil wiring 46A in ratio of wiring width to wiring spacing.

The second electrode wiring 56A includes a second slit 52As extending from the center of the second electrode wiring 56A toward an outer side of the second electrode wiring 56A. The second electrode wiring 56A is annular and is open by the second slit 52As. The second slit 52As limits formation of a current loop in the second electrode wiring 56A.

The second capacitor end 57A overlaps the second signal terminal 47A of the second coil 42A, which is shown in FIG. 6. In plan view, the second capacitor end 57A is identical in shape to the second signal terminal 47A. The second capacitor end 57A is arranged at an inner side of the second electrode wiring 56A and is connected to the second electrode wiring 56A. The shape of the second capacitor end 57A may be changed in any manner. Moreover, the second capacitor end 57A may be omitted.

The second capacitor ground terminal 58 overlaps the second ground terminal 48 of the second coil 42A, which is shown in FIG. 6. In plan view, the second capacitor ground terminal 58 is identical in shape to the second ground terminal 48. The second capacitor ground terminal 58 is arranged between the second capacitor electrode 52A of the capacitor 50A and the second capacitor electrode 52B of the capacitor 50B. The second capacitor ground terminal 58 is electrically connected to each interconnect part of the second electrode wiring 56A by an interconnect 58A extending toward the center of the second electrode wiring 56A.

In plan view, the second capacitor electrode 52B of the capacitor 50B, shown in FIG. 8, overlaps the second coil 42B, shown in FIG. 6. The second capacitor electrode 52B is formed from a conductive material. More preferably, the second capacitor electrode 52B is formed from a nonmagnetic material. As the nonmagnetic material, one or more is selected from Ti, TiN, TiW, Ta, TaN, Cr, CrSi, Au, Ag, Cu, Al, and W. Alternatively, the second capacitor electrode 52B may be formed of a conductive material other than the materials described above.

The second capacitor electrode 52B includes a second electrode wiring 56B, a second capacitor end 57B, and a second capacitor ground terminal 58. Thus, the second capacitor electrodes 52A and 52B include the second capacitor ground terminal 58 as a common terminal in the same manner as the second coils 42A and 42B, shown in FIG. 6.

The second electrode wiring 56B is elliptical and spiral in the same manner as the second coil wiring 46B, shown in FIG. 6. The second electrode wiring 56B is identical in shape to the second coil wiring 46B of the second coil 42B, shown in FIG. 6. That is, the second electrode wiring 56B is set to be equal to the second coil wiring 46B in ratio of wiring width to wiring spacing. The second electrode wiring 56B includes a second slit 52Bs extending from the center of the second electrode wiring 56B toward an outer side of the second electrode wiring 56B. The second electrode wiring 56B is annular and is open by the second slit 52Bs. The second slit 52Bs limits formation of a current loop in the second electrode wiring 56B.

The second capacitor end 57B overlaps the second signal terminal 47B of the second coil 42B, shown in FIG. 6. In plan view, the second capacitor end 57B is identical in shape to the second signal terminal 47B. The second capacitor end 57B is arranged at an inner side of the second electrode wiring 56B and is connected to the second electrode wiring 56B. The shape of the second capacitor end 57B may be changed in any manner. Moreover, the second capacitor end 57B may be omitted.

The second capacitor ground terminal 58 is electrically connected to each interconnect part of the second electrode wiring 56B by an interconnect 58B extending toward the center of the second electrode wiring 56B.

As shown in FIG. 9, the first capacitor electrode 51A and the second capacitor electrode 52A of the capacitor 50A are arranged between the first coil 41A and the second coil 42A of the transformer 40A. The first capacitor electrode 51A and the second capacitor electrode 52A are opposed to each other in the z-direction with multiple insulation films 85 interposed.

At least one insulation film 85 is interposed between the first capacitor electrode 51A and the first coil 41A. In the present embodiment, one insulation film 85 is interposed. At least one insulation film 85 is interposed between the second capacitor electrode 52A and the second coil 42A. In the present embodiment, one insulation film 85 is interposed.

The first capacitor electrode 51A is configured to be a conductive layer embedded in one insulation film 85. More specifically, the first capacitor electrode 51A is embedded in an insulation film 852. The insulation film 852 includes a capacitor groove 144 (first capacitor groove) extending through the first insulation film 85A and the second insulation film 85B in the z-direction. The conductive layer forming the first capacitor electrode 51A is embedded in the capacitor groove 144 of the insulation film 852. The insulation film 852, in which the first capacitor electrode 51A is embedded, is covered by insulation films 85 located next to the insulation film 852 in the z-direction. Thus, the first capacitor electrode 51A is embedded in the insulation film 85.

The second capacitor electrode 52A is configured to be a conductive layer embedded in one insulation film 85. More specifically, the second capacitor electrode 52A is embedded in an insulation film 853. The insulation film 853 includes a capacitor groove 144 (second capacitor groove) extending through the first insulation film 85A and the second insulation film 85B in the z-direction. The conductive layer forming the second capacitor electrode 52A is embedded in the capacitor groove 144 of the insulation film 853. The insulation film 853, in which the second capacitor electrode 52A is embedded, is covered by insulation films 85 located next to the insulation film 853 in the z-direction. Thus, the second capacitor electrode 52A is embedded in the insulation films 85.

The distance between the first capacitor electrode 51A and the second capacitor electrode 52A is determined by the thickness of the insulation film 85 and the number of the insulation films 85 stacked between the first capacitor electrode 51A and the second capacitor electrode 52A. The distance is set in accordance with the insulation voltage or electric field strength of the transformer chip 80.

As shown in FIG. 9, the first capacitor electrode 51A is electrically connected to the first coil 41A.

The first coil 41A includes the first coil wiring 43A, the first signal terminal 44A, and the first ground terminal 45. The first capacitor electrode 51A includes the first electrode wiring 53A, the first capacitor end 54A, and the first capacitor ground terminal 55. The first electrode wiring 53A overlaps the first coil wiring 43A in the z-direction. The first capacitor end 54A overlaps the first signal terminal 44A in the z-direction. The first capacitor ground terminal 55 overlaps the first ground terminal 45 in the z-direction.

The first capacitor ground terminal 55 of the first capacitor electrode 51A is connected to the first ground terminal 45 of the first coil 41A. The insulation film 85, which is arranged between the first capacitor electrode 51A and the first coil 41A, includes vias 137 extending through the insulation film 85 in the z-direction. The vias 137 connect the first capacitor ground terminal 55 of the first capacitor electrode 51A and the first ground terminal 45 of the first coil 41A. Thus, the first capacitor electrode 51A is connected to the first ground terminal 45 of the first coil 41A.

As shown in FIG. 9, the second capacitor electrode 52A is electrically connected to the second coil 42A.

The second coil 42A includes the second coil wiring 46A, the second signal terminal 47A, and the second ground terminal 48. The second capacitor electrode 52A includes the second electrode wiring 56A, the second capacitor end 57A, and the second capacitor ground terminal 58. The second electrode wiring 56A overlaps the second coil wiring 46A in the z-direction. The second capacitor end 57A overlaps the second signal terminal 47A in the z-direction. The second capacitor ground terminal 58 overlaps the second ground terminal 48 in the z-direction.

The second capacitor ground terminal 58 of the second capacitor electrode 52A is connected to the second ground terminal 48 of the second coil 42A. The insulation film 85, which is arranged between the second capacitor electrode 52A and the second coil 42A, includes vias 138 extending though the insulation film 85 in the z-direction. The vias 138 connect the second capacitor ground terminal 58 of the second capacitor electrode 52A and the second ground terminal 48 of the second coil 42A. The second capacitor electrode 52A is connected to the second ground terminal 48 of the second coil 42A.

As shown in FIG. 4, in plan view, the first electrode pads 81 and the second electrode pads 82 are arranged in the inner region 87.

As shown in FIG. 9, the electrode pads 81 and 82 are formed on the uppermost insulation film 85U. The uppermost insulation film 85U is aligned with the electrode pads 81 and 82. In the present embodiment, the electrode pad 81 and the electrode pad 82 are located farther away from the substrate 83 than the second coils 42A and 42B of the transformers 40A and 40B. In other words, the electrode pad 81 and the electrode pad 82 are located above the second coils 42A and 42B of the transformers 40A and 40B. In the present embodiment, the distance between the first coil 41A and the second coil 42A is greater than the distance between the second coil 42A and each of the electrode pads 81 and 82 in the z-direction.

As shown in FIG. 4, in plan view, each first electrode pad 81 is aligned with one of the two transformers 40A or one of the two transformers 40B in the x-direction or arranged between the transformer 40A and the transformer 40B in the x-direction. The first electrode pads 81 are arranged closer to the chip side surface 80b than the transformers 40A and 40B are in the y-direction. In other words, the first electrode pads 81 are arranged between the chip side surface 80b and the transformers 40A and 40B in the y-direction. In other words, in plan view, the first electrode pads 81 are arranged closer to the low-voltage leads 92 (refer to FIG. 2) than the transformers 40A and 40B are.

In the description hereafter, the first electrode pad 81 that is aligned with the transformer 40A in the x-direction is referred to as a first electrode pad 81A for the sake of brevity. The first electrode pad 81 that is aligned with the transformer 40B in the x-direction is referred to as a first electrode pad 81B for the sake of brevity. The first electrode pad 81 arranged between the transformer 40A and the transformer 40B in the x-direction is referred to as a first electrode pad 81C. The first electrode pads 81A to 81C will be referred to as the first electrode pads 81 when the description is common to the first electrode pads 81A to 81C.

The first electrode pads 81A are arranged to overlap the transformer 40A as viewed in the y-direction. The first electrode pads 81B are arranged to overlap the transformer 40B as viewed in the y-direction. The first electrode pads 81C are arranged to overlap a portion located between the transformer 40A and the transformer 40B in the x-direction as viewed in the y-direction. The first electrode pads 81A to 81C are aligned with each other in the y-direction and spaced apart from each other in the x-direction.

As shown in FIG. 4, in plan view, the first electrode pads 82 are arranged in the transformers 40A and 40B and between the transformer 40A and the transformer 40B in the x-direction. As viewed in the x-direction, the second electrode pads 82 are arranged to overlap the transformers 40A and 40B. In the description hereafter, the second electrode pad 82 arranged in the transformer 40A is referred to as a second electrode pad 82A, the second electrode pad 82 arranged in the transformer 40B is referred to as a second electrode pad 82B, and the second electrode pad arranged between the transformer 40A and the transformer 40B is referred to as the second electrode pad 82C. The second electrode pads 82A to 82C will be referred to as the second electrode pads 82 when the description is common to the second electrode pads 82A to 82C.

The second electrode pads 82A are arranged in an inner space of the transformer defined by the elliptical, spiral second coil 42A. The second electrode pads 82B are arranged in an inner space of the transformer 40B defined by the elliptical, spiral second coil 42A. The second electrode pads 82C are arranged between the transformer 40A and the transformer 40B in the x-direction. Each of the second electrode pads 82A to 82C is formed of two electrode pads adjacent to each other in the x-direction. The second electrode pads 82A to 82C are aligned with each other in the y-direction and spaced apart from each other in the x-direction.

As shown in FIGS. 4, 5, and 9, the first electrode pads 81A are electrically connected to the first coil 41A of the transformer 40A. The first electrode pads 81C are electrically connected to the first coil 41A of the transformer 40A. As shown in FIGS. 4 and 5, the first electrode pads 81B are electrically connected to the first coil 41B of the transformer 40B. The first electrode pads 81C are electrically connected to the first coil 41B of the transformer 40B. That is, the first electrode pads 81C are common to the transformer 40A and the transformer 40B.

As shown in FIGS. 4, 6, and 9, each second electrode pad 82A is separately electrically connected to the second coil 42A of the transformer 40A. The second electrode pads 82C are electrically connected to the second coil 42A of the transformer 40A. The second electrode pads 82B, shown in FIGS. 4 and 6, are electrically connected to the second coil 42B of the transformer 40B. The second electrode pads 82C are electrically connected to the second coil 42B of the transformer 40B. That is, the second electrode pads 82C are common to the transformer 40A and the transformer 40B.

As shown in FIGS. 5 and 6, the transformer chip 80 includes interconnects separately connecting the electrode pads 81A to 81C and 82A to 82C to the coils 41A, 41B, 42A, and 42B of the transformers 40A and 40B. In the present embodiment, the interconnects include the interconnects 131A, 131B, and 131C, which connect the first electrode pads 81A to 81C to the first coils 41A and 41B. The interconnects 131A to 131C are arranged in the inner region 87. The interconnects 131A to 131C are formed from a material including one or more selected from Ti, TiN, Au, Ag, Cu, Al, and W.

As shown in FIG. 5, the interconnect 131A connects the first electrode pad 81A to the first signal terminal 44A of the first coil 41A of the transformer 40A. The interconnect 131B connects the first electrode pad 81B to the first signal terminal 44B of the first coil 41B of the transformer 40B. The interconnect 131C connects the first electrode pad 81C to the second end of the first coil 41A of the transformer 40A and the second end of the first coil 41B of the transformer 40B. The interconnects 131A to 131C have the same structure. Thus, in the description hereafter, the structure of the interconnect 131A will be described. The interconnects 131B and 131C will not be described in detail.

As shown in FIG. 9, the interconnect 131A includes a first interconnect part 132A extending through the insulation films 85 in the z-direction and a second interconnect part 133A extending in the y-direction.

The first interconnect part 132A is arranged to overlap the first electrode pad 81A in plan view and is connected to the first electrode pad 81A. The first interconnect part 132A extends through the insulation films 85 from the insulation film 85 that is located immediately below the uppermost insulation film 85U to the insulation film 85 that is located above the lowermost insulation film 85L with one insulation film 85 interposed. The first interconnect part 132A includes flat interconnect pieces and vias. The interconnect pieces are located at the same position as the insulation films 85l and 854, in which the coils 41A and 42A are arranged. The vias are arranged between the two interconnect pieces in the z-direction, between the upper interconnect piece and the first electrode pad 81A, and between the lower interconnect piece and the second interconnect part 133A.

The second interconnect part 133A is arranged closer to the substrate 83 than the first interconnect part 132A is. The second interconnect part 133A is arranged closer to the substrate 83 than the first coil 41A is. In the present embodiment, the second interconnect part 133A is arranged in the insulation film 85 located immediately above the lowermost insulation film 85L among the insulation films 85. Of opposite ends of the second interconnect part 133A in the x-direction, a first end is located closer to the chip side surface 80b of the transformer chip 80 and overlaps the first interconnect part 132A in plan view. The second interconnect part 133A is connected to the first interconnect part 132A. The second interconnect part 133A includes a second end opposite to the first end. In plan view, the second end is arranged to overlap the first coil 41A of the transformer 40A. More specifically, in plan view, the second end overlaps the first signal terminal 44A of the first coil 41A of the transformer 40A. The second interconnect part 133A includes vias 134A connecting the second interconnect part 133A and the first signal terminal 44A.

As shown in FIG. 9, the interconnect 131C includes a first interconnect part 132C extending through the insulation films 85 in the z-direction and a second interconnect part 133C extending in the y-direction.

The first interconnect part 132C and the first interconnect part 132A of the interconnect 131A have the same structure.

The first interconnect part 132C is arranged to overlap the first electrode pad 81C in plan view and is connected to the first electrode pad 81C. The first interconnect part 132C extends through the insulation films 85 from the insulation film 85 that is located immediately below the uppermost insulation film 85U to the insulation film 85 that is located above the lowermost insulation film 85L with one insulation film 85 interposed. The first interconnect part 132C includes flat interconnect pieces and vias. The interconnect pieces are located at the same position as the insulation films 85l and 854, in which the coils 41A and 42A are arranged. The vias are arranged between the two interconnect pieces in the z-direction, between the upper interconnect piece and the first electrode pad 81A, and between the lower interconnect piece and the second interconnect part 133C.

The second interconnect part 133C is arranged closer to the substrate 83 than the first interconnect part 132C is. The second interconnect part 133C is arranged closer to the substrate 83 than the first coil 41A is. In the present embodiment, the second interconnect part 133C is arranged in the insulation film 85 located immediately above the lowermost insulation film 85L among the insulation films 85. Of opposite ends of the second interconnect part 133C in the x-direction, a first end is located closer to the chip side surface 80b of the transformer chip 80 and overlaps the first interconnect part 132C in plan view. The second interconnect part 133C is connected to the first interconnect part 132C. The second interconnect part 133C includes a second end opposite to the first end. In plan view, the second end is arranged to overlap the first coil 41A of the transformer 40A. More specifically, in plan view, the second end overlaps the first ground terminal 45 of the first coil 41A of the transformer 40A. The second interconnect part 133C includes vias 134C connecting the second interconnect part 133C and the first signal terminal 44A. The second interconnect part 133C of the interconnect 131C is electrically connected to the substrate 83 by vias 136 that extend through the lowermost insulation film 85L. The vias 136 may be omitted.

As shown in FIG. 9, the second electrode pad 82A is electrically connected to the second signal terminal 47A of the second coil 42A by vias 135A extending through the uppermost insulation film 85U.

The second electrode pad 82C is electrically connected to the second ground terminal 48 of the second coil 42A by vias 135C extending through the uppermost insulation film 85U.

As shown in FIGS. 4 and 6, in the present embodiment, the transformer chip 80 includes a dummy pattern 120 arranged around the second coils 42A and 42B of the transformers 40A and 40B. The dummy pattern 120 is a dummy coil pattern.

The dummy pattern 120 is arranged in the inner region 87 and includes a first dummy pattern 121, a second dummy pattern 122, and a third dummy pattern 123. The dummy patterns 121 to 123 are formed from a material including one or more selected from Ti, TiN, Au, Ag, Cu, Al, and W.

In plan view, the first dummy pattern 121 is arranged in a region between the second coil 42A of the transformer 40A and the second coil 42B of the transformer 40B in the x-direction. The first dummy pattern 121 is patterned differently from the second coils 42A and 42B. The first dummy pattern 121 is electrically connected to the second ground terminal 48 of the second coil 42A. The first dummy pattern 121 may be electrically connected to the second ground terminal 48 of at least one of the two second coils 42A. Thus, the first dummy pattern 121 has the same potential as the second coils 42A and 42B. Therefore, as the second reference potential of the second coils 42A and 42B changes, the voltage of the first dummy pattern 121 may become higher than that of the first coil 41B in the same manner as the second coil 42B.

Although not shown, the first dummy pattern 121 is aligned with the second coils 42A and 42B in the z-direction. Thus, the first dummy pattern 121 is located farther away from the substrate 83 than the first coils 41A and 41B are. In other words, the dummy pattern 120 is arranged around coils of the transformers 40A and 40B located closer to the chip main surface 80s of the transformer chip 80.

The first dummy pattern 121 and the second coils 42A and 42B have the same voltage. This limits voltage drops between the first dummy pattern 121 and the second coils 42A and 42B. Thus, concentration of an electric field on the second coils 42A and 42B is limited.

As shown in FIG. 6, the third dummy pattern 123 is formed to surround the second coils 42A and 42B of the transformers 40A and 40B in plan view. The third dummy pattern 123 is electrically connected to the first dummy pattern 121. Thus, in the third dummy pattern 123, similar to the first dummy pattern 121, as the second reference potential of the second coil 42B changes, the voltage of the third dummy pattern 123 may become higher than that of the first coil 41B.

As shown in FIG. 9, the third dummy pattern 123 is aligned with the second coil 42A in the z-direction. Although not shown, the third dummy pattern 123 is aligned with the second coil 42B in the z-direction. Thus, the third dummy pattern 123 is located farther away from the substrate 83 than the first coils 41A and 41B are. As described above, the dummy patterns 121 to 123 are aligned with each other in the z-direction.

The third dummy pattern 123 and the second coils 42A and 42B have the same voltage. This limits voltage drops between the third dummy pattern 123 and the second coils 42A and 42B. Thus, concentration of an electric field on the second coils 42A and 42B is limited.

As shown in FIG. 6, the second dummy pattern 122 is formed to surround the third dummy pattern 123 in plan view. The second dummy pattern 122 is independent of the second coils 42A and 42B. In other words, the second dummy pattern 122 is not electrically connected to the second coils 42A and 42B.

As shown in FIG. 9, the second dummy pattern 122 is aligned with the second coil 42A in the z-direction. Although not shown, the second dummy pattern 122 is aligned with the second coil 42B in the z-direction. Thus, the second dummy pattern 122 is located farther away from the substrate 83 than the first coils 41A and 41B are. The second dummy pattern 122 limits an increase in the electric field strength around the second coils 42A and 42B and limits concentration of the electric field on the second electrode pads 82A to 82C.

As shown in FIG. 8, in the present embodiment, the transformer chip 80 includes a dummy pattern 125 arranged around the second capacitor electrodes 52A and 52B of the capacitors 50A and 50B. The dummy pattern 125 and the dummy pattern 120, described above, have the same structure. The dummy pattern 125 is a dummy electrode pattern.

More specifically, the dummy pattern 125 is arranged in the inner region 87 and includes a first dummy pattern 126, a second dummy pattern 127, and a third dummy pattern 128. In an example, the dummy patterns 126 to 128 and the second capacitor electrode 52A are formed from the same material. The dummy pattern 125 includes a slit extending from the inside of the dummy pattern 125 toward the outside of the dummy pattern 125. The slit limits formation of a current loop in the dummy pattern 125. The dummy pattern 125 is a dummy electrode pattern.

In plan view, the first dummy pattern 126 is arranged in a region between the second capacitor electrode 52A of the capacitor 50A and the second capacitor electrode 52B of the capacitor 50B in the x-direction. The first dummy pattern 126 is patterned differently from the second capacitor electrodes 52A and 52B. The first dummy pattern 126 is electrically connected to the second capacitor ground terminal 58 of the second capacitor electrode 52A. The first dummy pattern 126 may be electrically connected to the second capacitor ground terminal 58 of at least one of the two second capacitor electrodes 52A. Thus, the first dummy pattern 126 has the same potential as the second capacitor electrodes 52A and 52B. Therefore, as the second reference potential of the second capacitor electrodes 52A and 52B changes, the voltage of the first dummy pattern 126 may become higher than that of the first capacitor electrode 51B in the same manner as the second capacitor electrode 52B.

Although not shown, the first dummy pattern 126 is aligned with the second capacitor electrodes 52A and 52B in the z-direction. Thus, the first dummy pattern 126 is located farther away from the substrate 83 than the first capacitor electrodes 51A and 51B are. In other words, the dummy pattern 125 is arranged around coils of the capacitors 50A and 50B located closer to the chip main surface 80s of the transformer chip 80.

When the first dummy pattern 126 and the second capacitor electrodes 52A and 52B have the same voltage, a voltage drop between the first dummy pattern 126 and the second capacitor electrodes 52A and 52B is limited. This limits concentration of an electric field on the second capacitor electrodes 52A and 52B.

As shown in FIG. 8, the third dummy pattern 128 is formed to surround the second capacitor electrodes 52A and 52B of the capacitors 50A and 50B in plan view. The third dummy pattern 128 is electrically connected to the first dummy pattern 126. Thus, in the third dummy pattern 128, similar to the first dummy pattern 126, as the second reference potential of the second capacitor electrode 52B changes, the voltage of the third dummy pattern 128 may become higher than the voltage of the first capacitor electrode 51B.

As shown in FIG. 9, the third dummy pattern 128 is aligned with the second capacitor electrode 52A in the z-direction. Although not shown, the third dummy pattern 128 is also aligned with the second capacitor electrode 52B in the z-direction. Thus, the third dummy pattern 128 is located farther away from the substrate 83 than the first capacitor electrodes 51A and 51B are. As described above, the dummy patterns 126 to 128 are aligned with each other in the z-direction.

When the third dummy pattern 128 and the second capacitor electrodes 52A and 52B have the same voltage, a voltage drop between the third dummy pattern 128 and the second capacitor electrodes 52A and 52B is limited. This limits concentration of an electric field on the second capacitor electrodes 52A and 52B.

As shown in FIG. 8, the second dummy pattern 127 is formed to surround the third dummy pattern 128 in plan view. The second dummy pattern 127 is independent of the second capacitor electrodes 52A and 52B. In other words, the second dummy pattern 127 is not electrically connected to the second capacitor electrodes 52A and 52B.

As shown in FIG. 9, the second dummy pattern 127 is aligned with the second capacitor electrode 52A in the z-direction. Although not shown, the second dummy pattern 127 is also aligned with the second capacitor electrode 52B in the z-direction. Thus, the second dummy pattern 127 is located farther away from the substrate 83 than the first capacitor electrodes 51A and 51B are. The second dummy pattern 127 limits an increase in the electric field strength around the second capacitor electrodes 52A and 52B and limits concentration of the electric field on the second electrode pads 82A to 82C.

As shown in FIG. 9, the transformer chip 80 includes a protection film 150 and a passivation film 160. The protection film 150 is formed on a surface 84s of the insulation layer 84. The protection film 150 protects the insulation layer 84. The protection film 150 is a film formed from a material including, for example, silicon oxide.

The passivation film 160 is a surface protection film for the transformer chip 80. The passivation film 160 is formed from a material including, for example, silicon nitride. The material including silicon nitride includes, for example, SiN and SiCN. In the present embodiment, the passivation film 160 is formed from a material including SiN. The passivation film 160 defines the chip main surface 80s of the transformer chip 80.

The first electrode pads 81 and the second electrode pads 82 are covered by the protection film 150 and the passivation film 160. The protection film 150 and the passivation film 160 each include openings partially exposing the first electrode pads 81 and the second electrode pads 82. Thus, each first electrode pad 81 includes an exposed surface configured to be connected to the wire W2. Also, each second electrode pad 82 includes an exposed surface configured to be connected to the wire W3.

As shown in FIGS. 3 and 4, the transformer chip 80 includes a resin layer 180 formed on the passivation film 160. The resin layer 180 is formed from a material including, for example, polyimide (PI). The resin layer 180 is separated by a separation groove 183 into an inner resin layer 181 and an outer resin layer 182. As shown in FIG. 4, in plan view, the separation groove 183 surrounds the transformers 40A and 40B. The resin layer 180 includes a first resin opening 184 exposing the first electrode pad 81 and a second resin opening 185 exposing the second electrode pad 82.

FIG. 10 is an enlarged partial view of FIG. 9 showing an example of the structure of the second coil 42A and the second capacitor electrode 52A. In the example of the structure, the second coil 42A and the second capacitor electrode 52A are formed from Cu.

The coil groove 141 is elliptical and spiral and is formed on the insulation film 854. The coil groove 141 extends through the second insulation film 85B and the first insulation film 85A that is located below the second insulation film 85B. Therefore, the upper end and the lower end of the coil groove 141 are respectively open to the first insulation film 85A of the upper insulation film 85 and the second insulation film 85B of the lower insulation film 85.

A barrier film 142 is formed on the wall surface (side wall surface and bottom wall surface) of the coil groove 141. The barrier film 142 is formed on the side wall surface and the bottom wall surface so that the coil groove 141 has a cavity that is open upward. In the embodiment, the barrier film 142 is formed from a material including Ta, TaN, Ti, TiN, or the like. A body layer 143 is embedded in the coil groove 141 at an inner side of the barrier film 142. This forms the second coil 42A, which is an example of an embedded coil formed of the barrier film 142 and the body layer 143. The body layer 143 is formed from a material including one or more selected from Cu, Al, and W.

The second coil 42A includes an upper surface that is flush with the upper surface of the insulation film 85. As a result, the side surface, the upper surface, and the lower surface of the second coil 42A are in contact with different insulation films 85. More specifically, in the insulation film 854, in which the second coil 42A is embedded, the first insulation film 85A and the second insulation film 85B are in contact with the side surface of the second coil 42A. In the insulation film 85, which is formed above the insulation film 854, only the first insulation film 85A, which is the lower layer, is in contact with the upper surface of the second coil 42A. In the insulation film 85 located below, only the second insulation film 85B, which is the upper layer, is in contact with the lower surface of the second coil 42A.

The capacitor groove 144 is elliptical and spiral and is formed in the insulation film 853. The capacitor groove 144 extends through the second insulation film 85B and the first insulation film 85A that is located below the second insulation film 85B. Therefore, the upper end and the lower end of the capacitor groove 144 are respectively open to the first insulation film 85A of the upper insulation film 85 and the second insulation film 85B of the lower insulation film 85.

A barrier film 145 is formed on the wall surface (side wall surface and bottom wall surface) of the capacitor groove 144. The barrier film 145 is formed on the side wall surface and the bottom wall surface so that the capacitor groove 144 has a cavity that is open upward. In the embodiment, the barrier film 145 is formed from a material including Ta, TaN, Ti, TiN, or the like. A body layer 146 is embedded in the capacitor groove 144 at an inner side of the barrier film 145. This forms the second capacitor electrode 52A, which is an example of an embedded capacitor electrode formed of the barrier film 145 and the body layer 146. The body layer 146 is formed from a material including one or more selected from Cu, Al, and W.

The second capacitor electrode 52A includes an upper surface that is flush with the upper surface of the insulation film 85. As a result, the side surface, the upper surface, and the lower surface of the second capacitor electrode 52A are in contact with different insulation films 85. More specifically, in the insulation film 853, in which the second capacitor electrode 52A is embedded, the first insulation film 85A and the second insulation film 85B are in contact with the side surface of the second capacitor electrode 52A. In the insulation film 85 formed above the insulation film 853, only the first insulation film 85A, which is the lower layer, is in contact with the upper surface of the second capacitor electrode 52A. In the insulation film 85 located below, only the second insulation film 85B, which is the upper layer, is in contact with the lower surface of the second capacitor electrode 52A.

Although not described and shown, the first coil 41A is formed in the same manner as the second coil 42A by embedding a barrier film and a body layer in a coil groove. Also, the first capacitor electrode 51A is formed in the same manner as the second capacitor electrode 52A by embedding a barrier film and a body layer in a coil groove.

The interconnects 131A and 131C, shown in FIG. 9, are formed in the same manner as the second coil 42A and the second capacitor electrode 52A by embedding a barrier film and a body layer in a groove extending through the insulation film 85. Although not described or shown, the interconnect 131B is formed in the same manner as the second coil 42A and the second capacitor electrode 52A by embedding a barrier film and a body layer in a groove extending through the insulation film 85.

FIG. 10 shows the dummy pattern 120 corresponding to the second coil 42A and the dummy pattern 125 corresponding to the second capacitor electrode 52A. The dummy patterns 120 and 125 are formed of the barrier films 142 and 145 and the body layers 143 and 146 in the same manner as the second coil 42A and the second capacitor electrode 52A.

Operation

The operation of the gate driver 10 according to the present embodiment will now be described.

Comparative Example

A comparative example of the gate driver 10 of the present embodiment will now be described.

Figure 11:
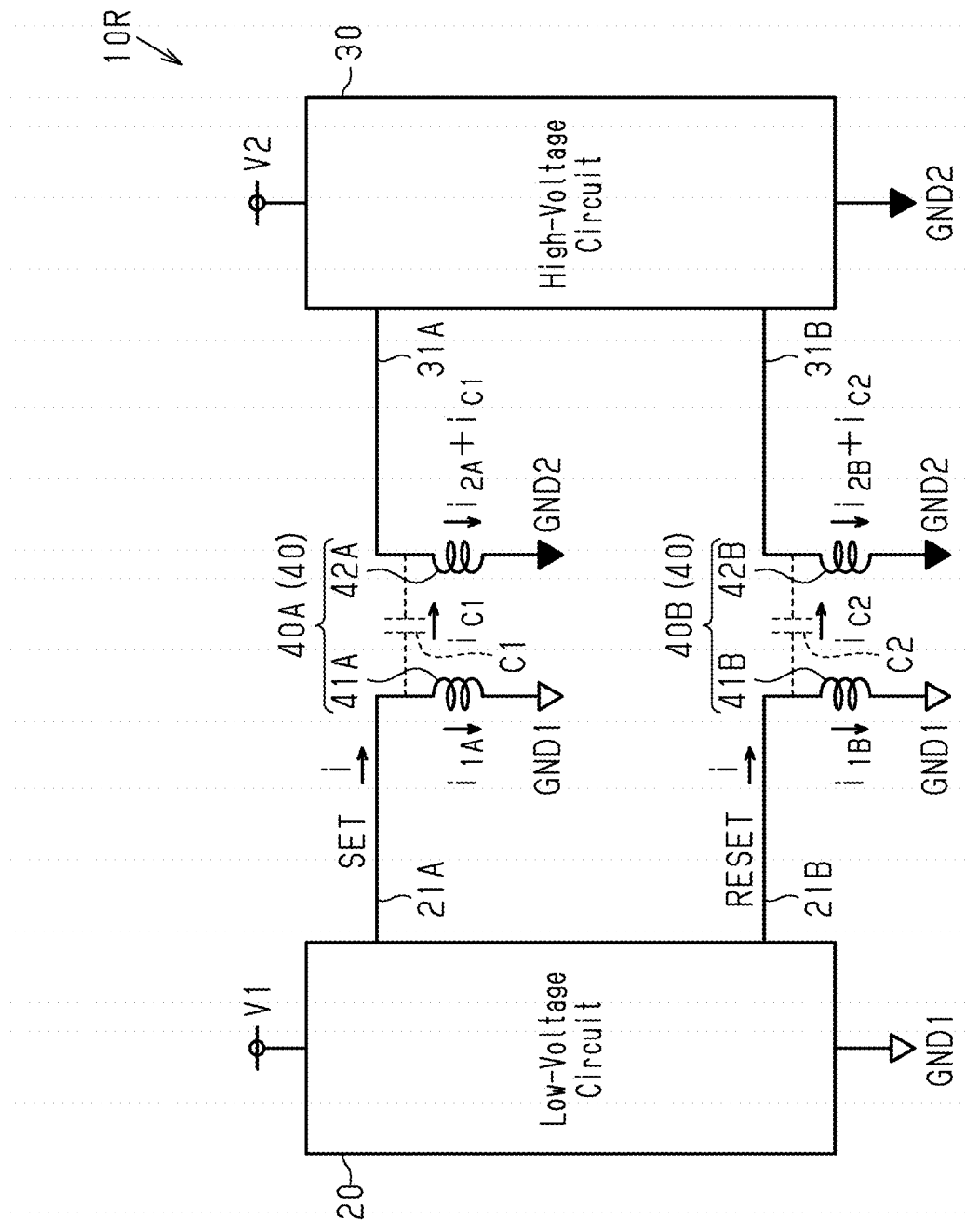
FIG. 11 is a circuit diagram showing an operation of a comparative example of a gate driver.

FIG. 11 shows a comparative example of a gate driver 10R. The gate driver 10R of the comparative example does not include the capacitors 50 (capacitors 50A and 50B), which are shown in FIG. 1. In the gate driver 10R, a current $i_{C_1}$ flowing to parasitic capacitance C1 between the first coil 41A and the second coil 42A of the transformer 40A may produce noise on a set signal transmitted from the low-voltage circuit 20 to the high-voltage circuit 30. This may result in an erroneous operation. Also, a current $I_{C_2}$ flowing to parasitic capacitance C2 between the first coil 41B and the second coil 42B of the transformer 40B may produce noise on a reset signal transmitted from the low-voltage circuit 20 to the high-voltage circuit 30. This may result in an erroneous operation.

To prevent an erroneous operation caused by the currents $i_{C1}$ and $i_{C2}$, the high-voltage circuit 30 includes a circuit that masks noise. In an example, after receiving a reset signal (RESET), the mask circuit masks reception of a signal for a fixed period. This prevents an erroneous operation caused by the currents $i_{C1}$ and $i_{C2}$ flowing to the second coils 42A and 42B due to the parasitic capacitances C1 and C2.

The capacitance values of the parasitic capacitances C1 and C2 may vary depending on each gate driver 10R and operational state. That is, the capacitance values of the parasitic capacitances C1 and C2 are inconstant. Therefore, the position of noise superimposed on the set signal and the reset signal may change. In this regard, the high-voltage circuit 30 needs to set a long mask period in accordance with positions where noise may be produced. Since a signal cannot be transmitted during the mask period, fast transmission of a signal from the low-voltage circuit 20 to the high-voltage circuit 30 is hindered. The same issue arises when a signal is transmitted from the high-voltage circuit 30 to the low-voltage circuit 20. Hence, the low-voltage circuit 20 also needs a mask circuit in the same manner as the high-voltage circuit 30.

Figure 12:
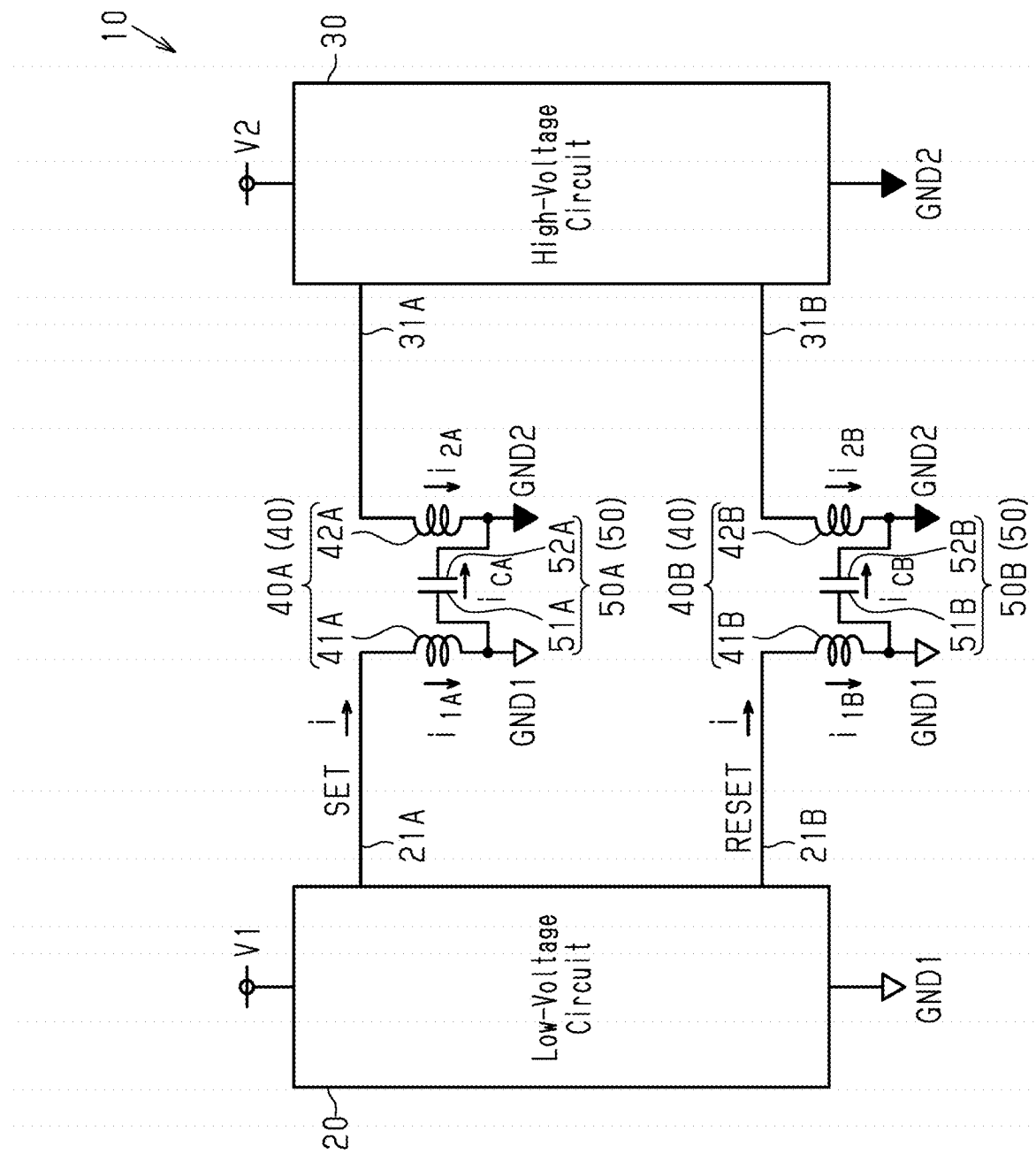
FIG. 12 is a circuit diagram showing an operation of the gate driver in the present embodiment.

FIG. 12 shows an operation of the gate driver 10 of the present embodiment.

As described above, the gate driver 10 of the present embodiment includes the transformer 40A including the first coil 41A and the second coil 42A and the transformer 40B including the first coil 41B and the second coil 42B. The gate driver 10 of the present embodiment further includes the capacitor 50A connected between the ground terminal of the first coil 41A and the ground terminal of the second coil 42A and the capacitor 50B connected between the ground terminal of the first coil 41B and the ground terminal of the second coil 42B.

The first capacitor electrode 51A of the capacitor 50A and the first coil 41A are electrically connected and have the same potential. The second capacitor electrode 52A of the capacitor 50A and the second coil 42A are electrically connected and have the same potential. The first capacitor electrode 51B of the capacitor 50B and the first coil 41B are electrically connected and have the same potential. The second capacitor electrode 52B of the capacitor 50B and the second coil 42B are electrically connected and have the same potential.

The transformer 40A and the transformer 40B are used to, for example, transmit a set signal (SET) and a reset signal (RESET) from the low-voltage circuit 20 toward the high-voltage circuit 30.

At this time, the set signal output from the low-voltage circuit 20 cause a current $i_{1A}$ to flow to the first coil 41A of the transformer 40A. A current $i_{2A}$ flows to the second coil 42A, which is magnetically coupled to the first coil 41A. The current $i_{2A}$ causes the high-voltage circuit 30 to generate a pulse signal, that is, receive a set signal.

The set signal causes a current $i_{CA}$ to flow between the first capacitor electrode 51A and the second capacitor electrode 52A of the capacitor 50A. The current $i_{CA}$ flows from the second capacitor electrode 52A to the ground terminal of the second coil 42A, namely, the ground GND2. This reduces the effect of the current $i_{CA}$ flowing to the capacitor 50A on the current $i_{2A}$ flowing to the second coil 42A of the transformer 40A. Thus, the effect on signal transmission between the low-voltage circuit 20 and the high-voltage circuit 30 is reduced.

The reset signal output from the low-voltage circuit 20 causes a current $i_{1B}$ to flow to the first coil 41B of the transformer 40B. A current $i_{2B}$ flows to the second coil 42B, which is magnetically coupled to the first coil 41B. The current $i_{2B}$ causes the high-voltage circuit 30 to generate a pulse signal, that is, receive a reset signal.

The reset signal causes a current $i_{CB}$ to flow between the first capacitor electrode 51B and the second capacitor electrode 52B of the capacitor 50B. The current $i_{CB}$ flows from the second capacitor electrode 52B to the ground terminal of the second coil 42B, namely, the ground GND2. This reduces the effect of the current $i_{2B}$ flowing to the second coil 42B of the transformer 40B on the current $i_{CB}$ flowing to the capacitor 50B. Thus, the effect on signal transmission between the low-voltage circuit 20 and the high-voltage circuit 30 is reduced.

The phase of current $i_{CA}$ is retarded from the phase of current i of the set signal in accordance with the impedance value of the transformer 40A and the capacitance value of the capacitor 50A. The phase of current $i_{CB}$ is retarded from the phase of current i of the reset signal in accordance with the impedance value of the transformer 40B and the capacitance value of the capacitor 50B. With this configuration, even when the currents $i_{CA}$ and $i_{CB}$ affect signal reception of the high-voltage circuit 30, a mask period may be set in accordance with timings of the currents $i_{CA}$ and $i_{CB}$. The mask period is shorter than that for the case of the parasitic capacitance C1. This reduces the effect on the fast signal transmission.

Advantages

The gate driver 10 of the present embodiment obtains the following advantages.

(1) The transformer chip 80 includes the insulation layer 84, the transformer 40A, and the capacitor 50A. The transformer 40A includes the first coil 41A and the second coil 42A embedded in the insulation layer 84 and separated from each other in the thickness-wise direction of the insulation layer 84. The capacitor 50A includes the first capacitor electrode 51A and the second capacitor electrode 52A arranged between the first coil 41A and the second coil 42A of the transformer 40A. The first capacitor electrode 51A is connected to the first ground terminal 45 of the first coil 41A. The second capacitor electrode 52A is connected to the second ground terminal 48 of the second coil 42A.

With this structure, the transformer 40A is used to, for example, transmit a set signal (SET) from the low-voltage circuit 20 toward the high-voltage circuit 30. The set signal causes the current $i_{CA}$ flowing through the capacitor 50A to flow from the second capacitor electrode 52A to the ground terminal of the second coil 42A, namely, the ground GND2. This reduces the effect of the current $i_{CA}$ flowing to the capacitor 50A on the current $i_{2A}$ flowing to the second coil 42A of the transformer 40A. Thus, the effect on signal transmission between the low-voltage circuit 20 and the high-voltage circuit 30 is reduced.

The transformer chip 80 includes the insulation layer 84, the transformer 40B, and the capacitor 50B. The transformer 40B includes the first coil 41B and the second coil 42B embedded in the insulation layer 84 and separated from each other in the thickness-wise direction of the insulation layer 84. The capacitor 50B includes the first capacitor electrode 51B and the second capacitor electrode 52B arranged between the first coil 41B and the second coil 42B of the transformer 40B. The first capacitor electrode 51B is connected to the first ground terminal 45 of the first coil 41B.

The second capacitor electrode 52B is connected to the second ground terminal 48 of the second coil 42B.

The transformer 40B is used to, for example, transmit a reset signal (RESET) from the low-voltage circuit 20 toward the high-voltage circuit 30. The reset signal causes the current $i_{CB}$ flowing through the capacitor 50B to flow from the second capacitor electrode 52B to the ground terminal of the second coil 42B, namely, the ground GND2. This reduces the effect of the current $i_{2B}$ flowing to the second coil 42B of the transformer 40B on the current $i_{CB}$ flowing to the capacitor 50B. Thus, the effect on signal transmission between the low-voltage circuit 20 and the high-voltage circuit 30 is reduced.

(2) The phase of current $i_{CA}$ flowing through the capacitor 50A is retarded from the phase of current i of the set signal in accordance with the impedance value of the transformer and the capacitance value of the capacitor 50A. The phase of current $i_{CB}$ flowing through the capacitor 50B is retarded from the phase of current i of the reset signal in accordance with the impedance value of the transformer 40B and the capacitance value of the capacitor 50B. With this configuration, even when the currents $i_{CA}$ and $i_{CB}$ affect signal reception of the high-voltage circuit 30, a mask period may be set in accordance with phases of the currents $i_{CA}$ and $i_{CB}$. This simplifies the design of the high-voltage circuit 30. The mask period is shorter than that for the case of the parasitic capacitance C1. This reduces the effect on the fast signal transmission.

(3) In plan view, the dummy pattern 120 is arranged around the second coils 42A and 42B. This structure limits concentration of an electric field on the second coils 42A and 42B.

(4) In plan view, the dummy pattern 125 is arranged around the second capacitor electrodes 52A and 52B. This structure limits concentration of an electric field on the second capacitor electrodes 52A and 52B.

(5) The gate driver 10 includes the low-voltage circuit 20 configured to be actuated by application of the first voltage V1, the high-voltage circuit 30 configured to be actuated by application of the second voltage V2 that is higher than the first voltage V1, and the transformer chip 80. The low-voltage circuit 20 and the high-voltage circuit 30 are connected by the transformer chip 80 and configured to transmit a signal through the transformer chip 80. The transformer chip 80 includes the transformers 40A and 40B and the capacitors 50A and 50B. The capacitor 50A includes the first capacitor electrode 51A and the second capacitor electrode 52A arranged between the first coil 41A and the second coil 42A of the transformer 40A. The capacitor 50B includes the first capacitor electrode 51B and the second capacitor electrode 52B arranged between the first coil 41B and the second coil 42B of the transformer 40B. The first capacitor electrodes 51A and 51B are connected to the first ground terminals 45 of the first coils 41A and 41B. The second capacitor electrodes 52A and 52B are connected to the second ground terminals 48 of the second coils 42A and 42B. This structure obtains the advantage (1) described above. Thus, the effect of the gate driver 10 on a transmitting signal is reduced.

(6) In an example of a structure in which the gate driver 10 includes a transformer and a capacitor 50, the gate driver 10 may include a low-voltage circuit chip including the low-voltage circuit 20, the transformer 40, and the capacitor 50. Alternatively, the gate driver may include a high-voltage circuit chip including the high-voltage circuit 30, the transformer 40, and the capacitor 50. In such structures, when the circuit configuration of the low-voltage circuit 20 or the high-voltage circuit 30 is changed, the corresponding chip entirely needs to be changed. This increases costs when different types of gate drivers are manufactured.

In this regard, in the present embodiment, the transformer 40 and the capacitor 50 are included in the transformer chip 80, which is independent of the low-voltage circuit chip and the high-voltage circuit chip 70. That is, the chip is dedicated to the transformer 40. This allows the common transformer chip 80 to be used for the low-voltage circuit 20 and the high-voltage circuit 30, which differ from each other. As a result, costs are reduced when manufacturing different types of gate drivers 10 that differ in at least one of the low-voltage circuit 20 and the high-voltage circuit 30.

(7) The first capacitor electrode 51A and the first coil 41A are formed to be identical in shape. The second capacitor electrode 52A and the second coil 42A are formed to be identical in shape. Thus, the first capacitor electrode 51A and the second capacitor electrode 52A are readily formed by the same process as that forming the first coil 41A and the second coil 42A.

MODIFIED EXAMPLES

The above embodiments exemplify, without any intention to limit, applicable forms of an insulation module and a gate driver according to the present disclosure. The insulation module and the gate driver according to the present disclosure can be applicable to forms differing from the above embodiments. In an example of such a form, the structure of the above embodiment is partially replaced, changed, or omitted, or a further structure is added to the above embodiment. The modified examples described below may be combined with one another as long as there is no technical inconsistency. In the modified examples, the same reference characters are given to those components that are the same as the corresponding components of the above embodiment. Such components will not be described in detail.

In the embodiments, the shape of the capacitor 50 in plan view may be changed.

Figure 13:
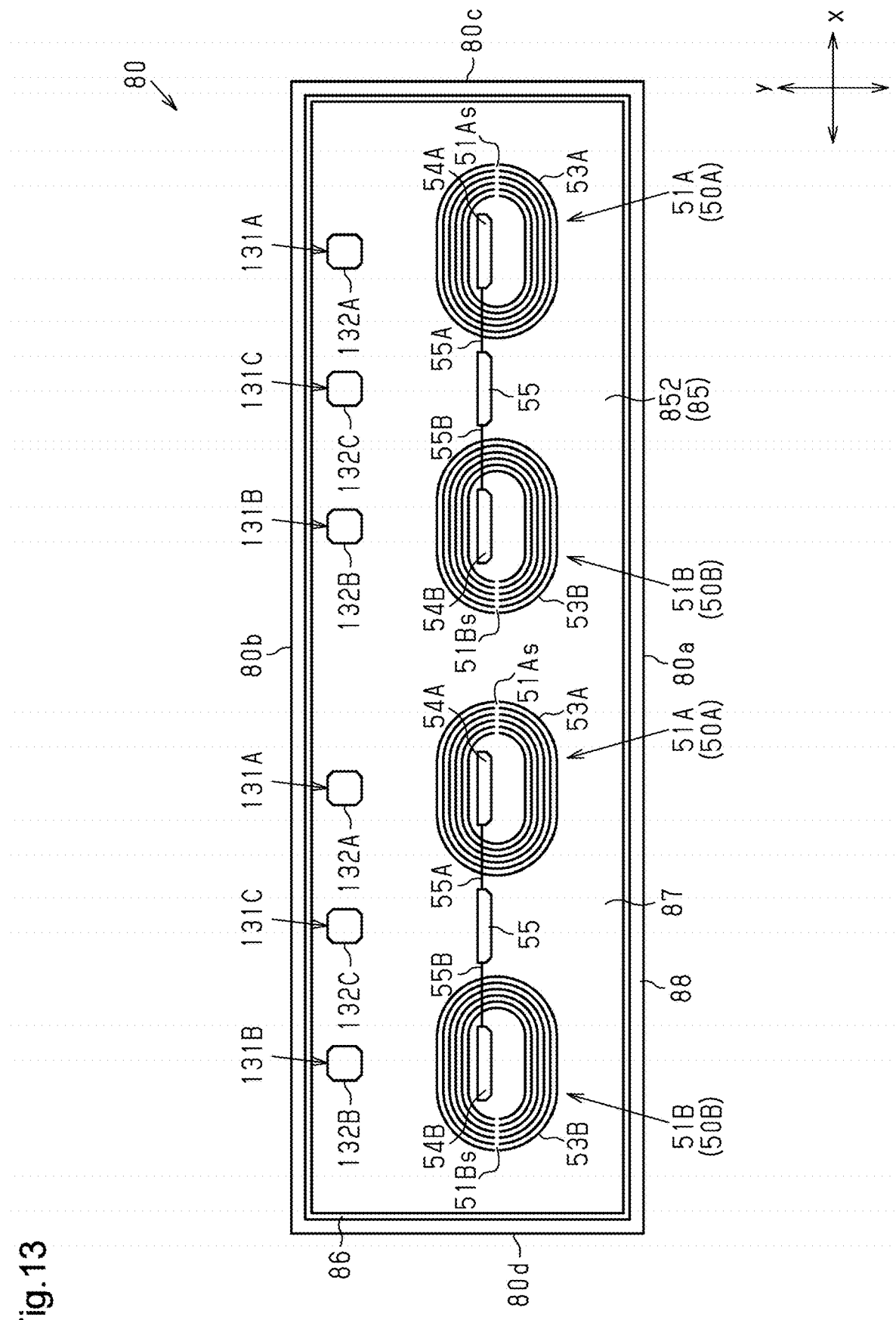
FIG. 13 is a schematic cross-sectional view showing a first capacitor electrode of a transformer chip in a modified example.

FIG. 13 shows a modified example of first capacitor electrodes 51A and 51B. The first capacitor electrode 51A is elliptical and annular and overlaps the first coil wiring 43A of the first coil 41A shown in FIG. 5. The first capacitor electrode 51A of this modified example includes a first electrode wiring 53A formed of annular wires arranged from an inner end 43i of the first coil wiring 43A to an outer end 43o of the first coil wiring 43A, which are shown in FIG. 5. The first capacitor electrode 51A includes a slit 51AS extending outward from the center. The first capacitor electrode 51A is annular and open by the slit 51As.

The first capacitor electrode 51B is elliptical and annular and overlaps the first coil wiring 43A of the first coil 41B shown in FIG. 5. The first capacitor electrode 51B of this modified example is formed of annular wires arranged from the inner end 43i of the first coil wiring 43B to the outer end 43o of the first coil wiring 43B, which are shown in FIG. 5. The first capacitor electrode 51B includes a first slit 51Bs extending outward from the center. The first capacitor electrode 51B is annular and open by the first slit 51Bs.

Figure 14:
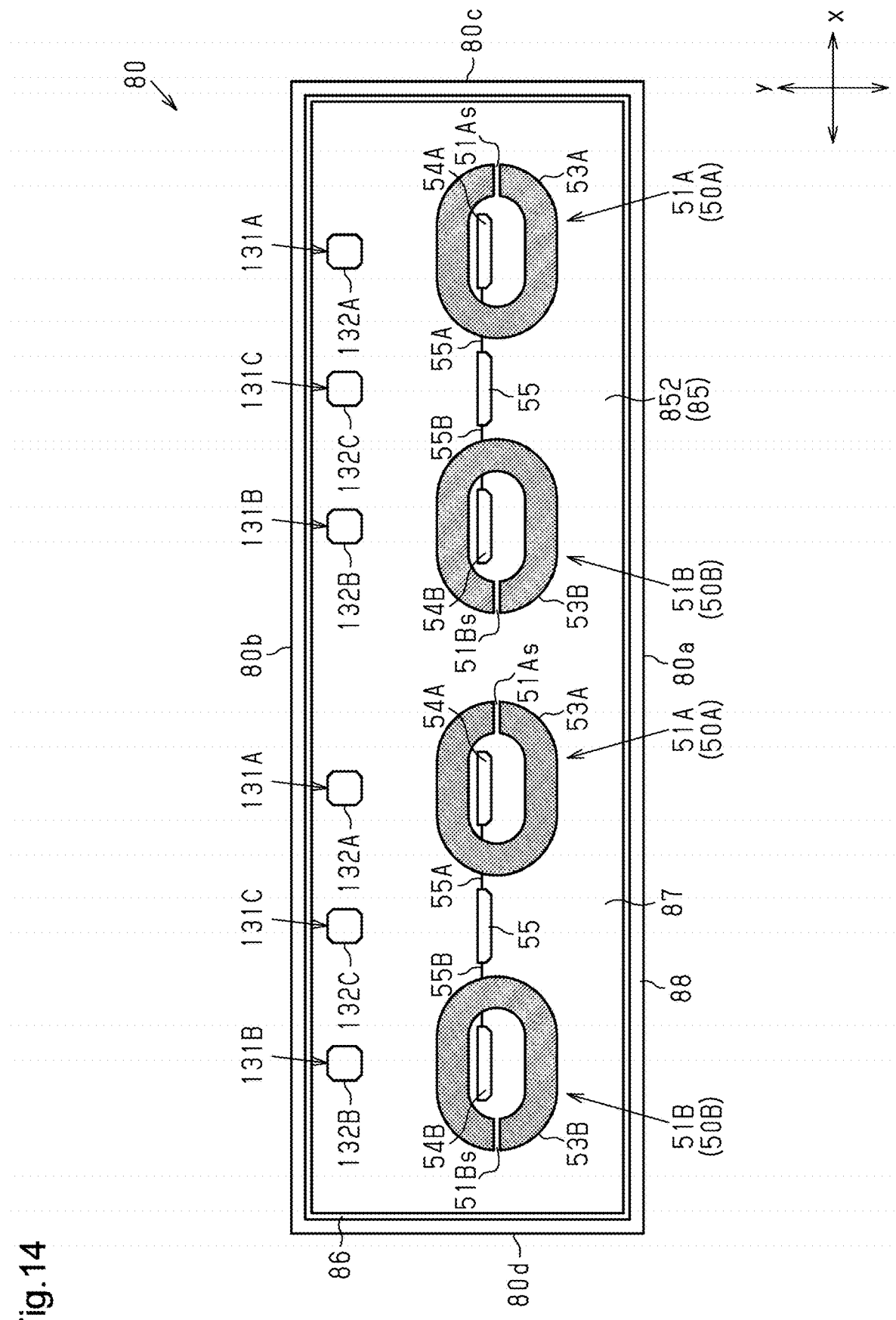
FIG. 14 is a schematic cross-sectional view showing a first capacitor electrode of a transformer chip in a modified example.

FIG. 14 shows a modified example of first capacitor electrodes 51A and 51B. The first capacitor electrode 51A is elliptical and annular and overlaps the first coil wiring 43A of the first coil 41A shown in FIG. 5. The first capacitor electrode 51A of this modified example includes a first electrode wiring 53A that is plate-shaped and continuous from the inner end 43i of the first coil wiring 43A to the outer end 43o of the first coil wiring 43B, which are shown in FIG.

5. The first capacitor electrode 51A includes a first slit 51As extending outward from the center. The first capacitor electrode 51A is annular and open by the first slit 51As.

The first capacitor electrode 51B is elliptical and annular and overlaps the first coil wiring 43A of the first coil 41B shown in FIG. 5. The first capacitor electrode 51B of this modified example includes a first electrode wiring 53B that is plate-shaped and continuous from the inner end 43i of the first coil wiring 43A to the outer end 43o of the first coil wiring 43B, which are shown in FIG. 5. The first capacitor electrode 51B includes a first slit 51Bs extending outward from the center. The first capacitor electrode 51B is annular and open by the first slit 51Bs.

Figure 15:
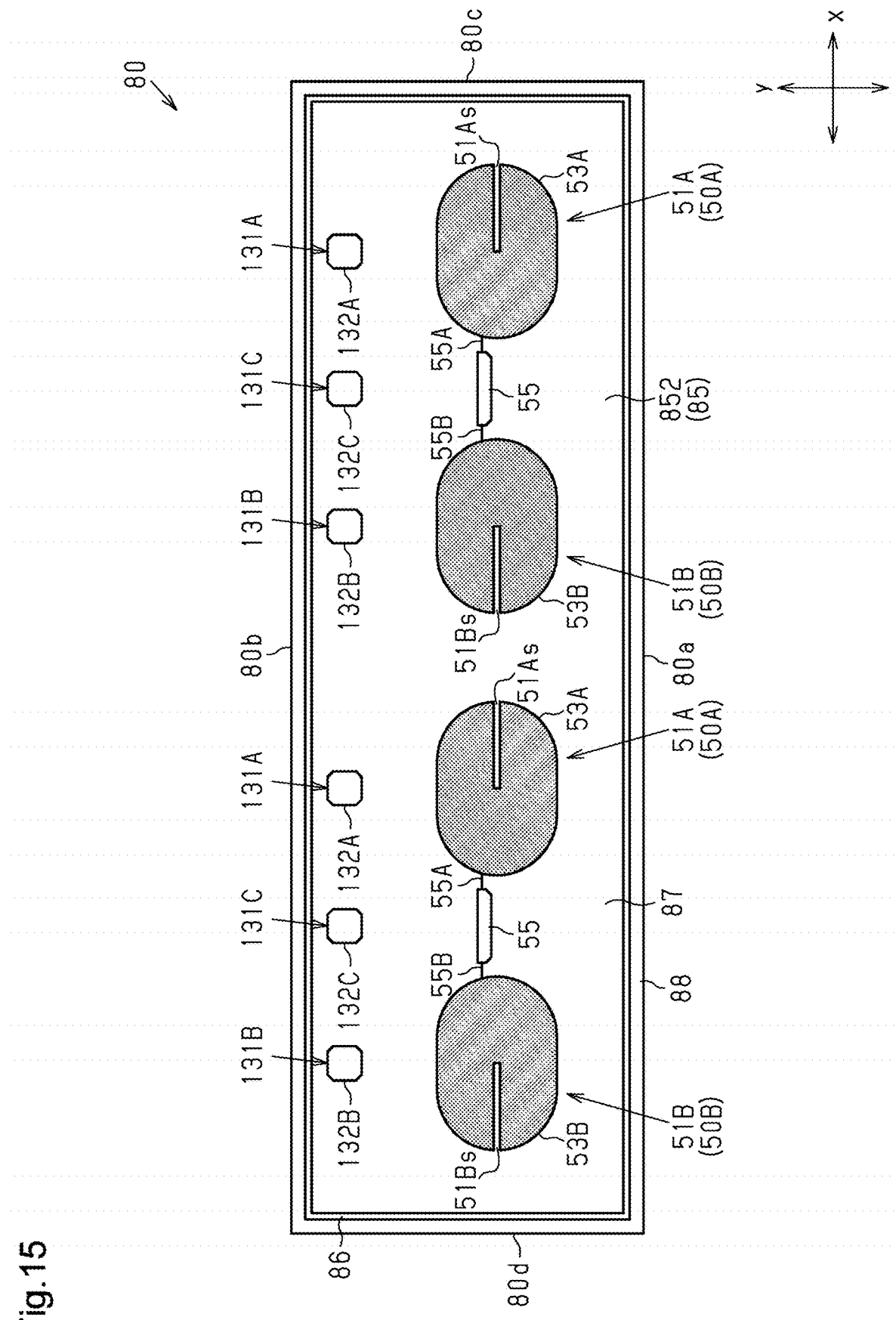
FIG. 15 is a schematic cross-sectional view showing a first capacitor electrode of a transformer chip in a modified example.

FIG. 15 shows a modified example of first capacitor electrodes 51A and 51B. The first capacitor electrode 51A is elliptical-plate-shaped and overlaps the first coil wiring 43A and the first signal terminal 44A of the first coil 41A, shown in FIG. 5. The first capacitor electrode 51A of this modified example includes a first electrode wiring 53A that is plate-shaped and continuous from the center of the first coil 41A to the outer end 43o of the first coil wiring 43B, shown in FIG. 5. Thus, the first electrode wiring 53A of this modified example includes the first signal terminal 44A, shown in FIG. 5. The first capacitor electrode 51A includes a first slit 51As extending outward from the center.

The first capacitor electrode 51B is elliptical-plate-shaped and overlaps the first coil wiring 43A and the first signal terminal 44B of the first coil 41B, shown in FIG. 5. The first capacitor electrode 51B of this modified example is plate-shaped and continuous from the center of the first coil 41B to the outer end 43o of the first coil wiring 43B, shown in FIG. 5. Thus, the first electrode wiring 53B of this modified example includes the first signal terminal 44B, shown in FIG. 5. The first capacitor electrode 51B includes a first slit 51Bs extending outward from the center.

In the embodiments, the cross section of the first coil 41A and the second coil 42A, the first capacitor electrode 51A and the second capacitor electrode 52A, and the dummy patterns 120 and 125 in the z-direction may be changed.

FIGS. 16 to 24 schematically show portions of the transformer chip 80 in a cross section in the z-direction.

Figure 16:
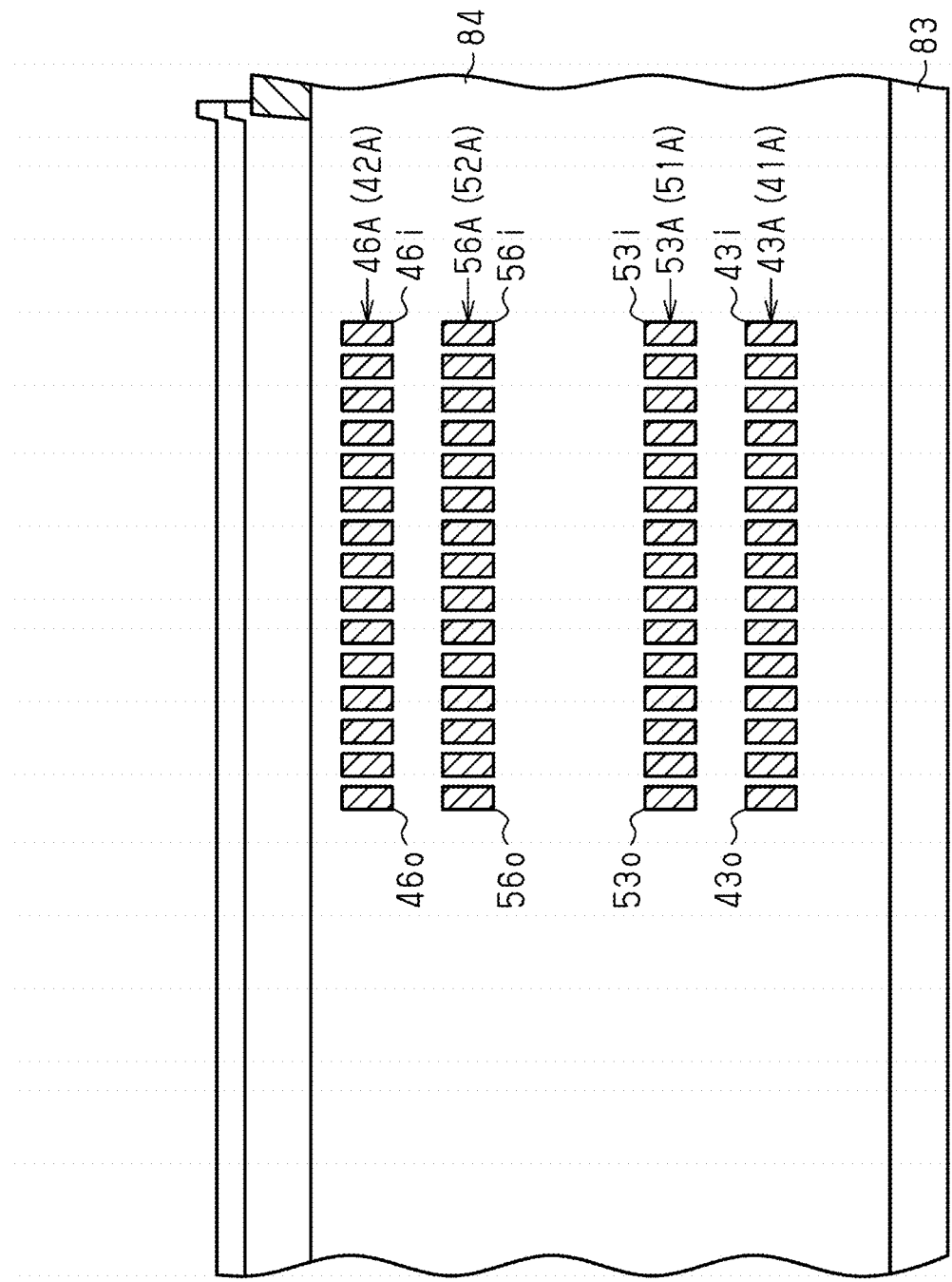
FIG. 16 is a schematic cross-sectional view of a modified example of a transformer chip showing a first coil, a second coil, a dummy pattern, a first capacitor electrode, and a second capacitor electrode.

As shown in FIG. 16, the dummy pattern 120 corresponding to the second coil 42A and the dummy pattern 125 (refer to FIG. 9) corresponding to the second capacitor electrode 52A may be omitted.

Figure 17:
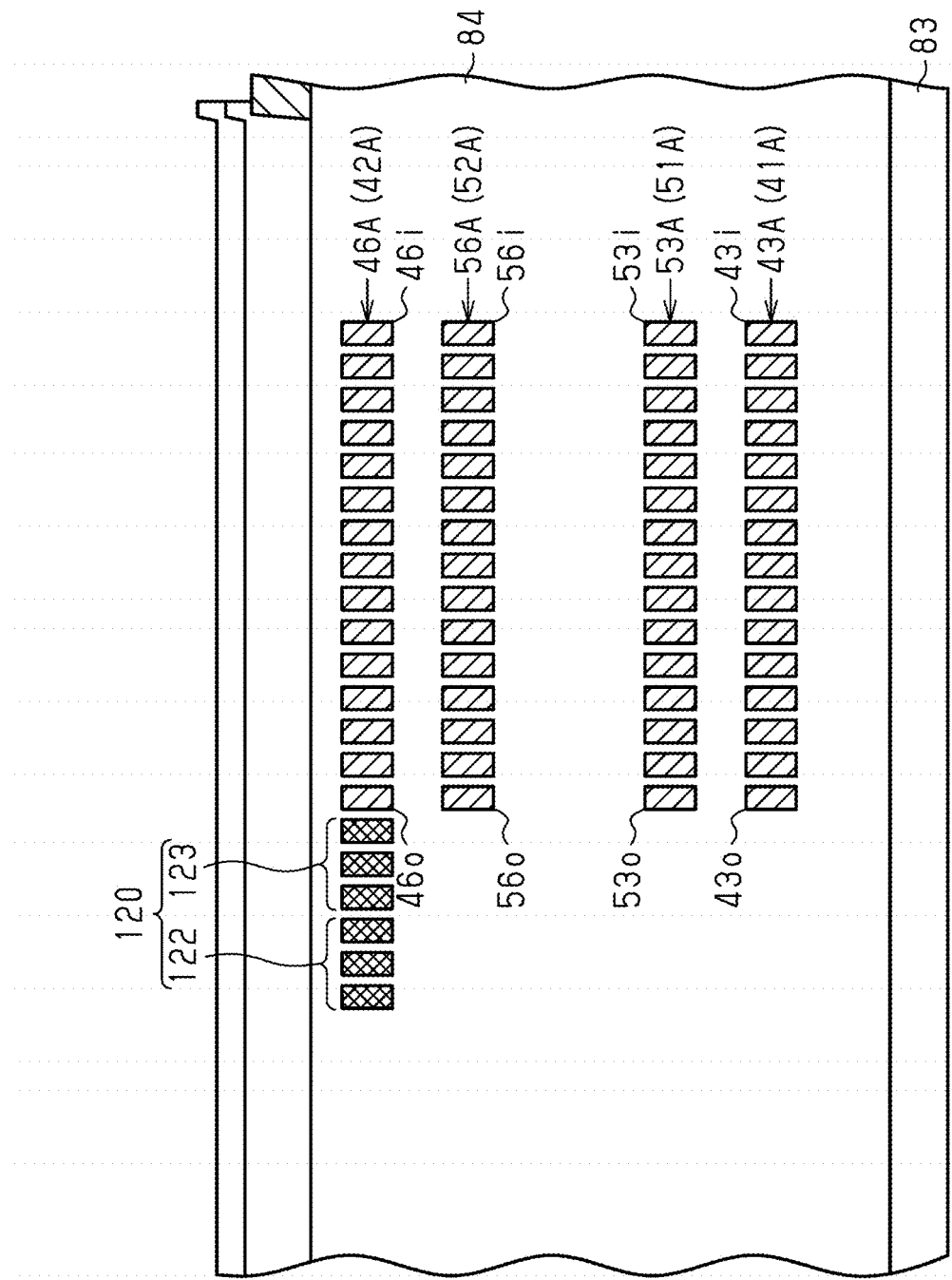
FIG. 17 is a schematic cross-sectional view of a modified example of a transformer chip showing a first coil, a second coil, a dummy pattern, a first capacitor electrode, and a second capacitor electrode.

As shown in FIG. 17, the dummy pattern 125 (refer to FIG. 9) corresponding to the second capacitor electrode 52A may be omitted so that only the dummy pattern 120 corresponding to the second coil wiring 46A of the second coil 42A is included. Alternatively, the dummy pattern 120 corresponding to the second coil wiring 46A of the second coil 42A may be omitted so that only the dummy pattern 125 (refer to FIG. 9) corresponding to the second capacitor electrode 52A is included.

Figure 18:
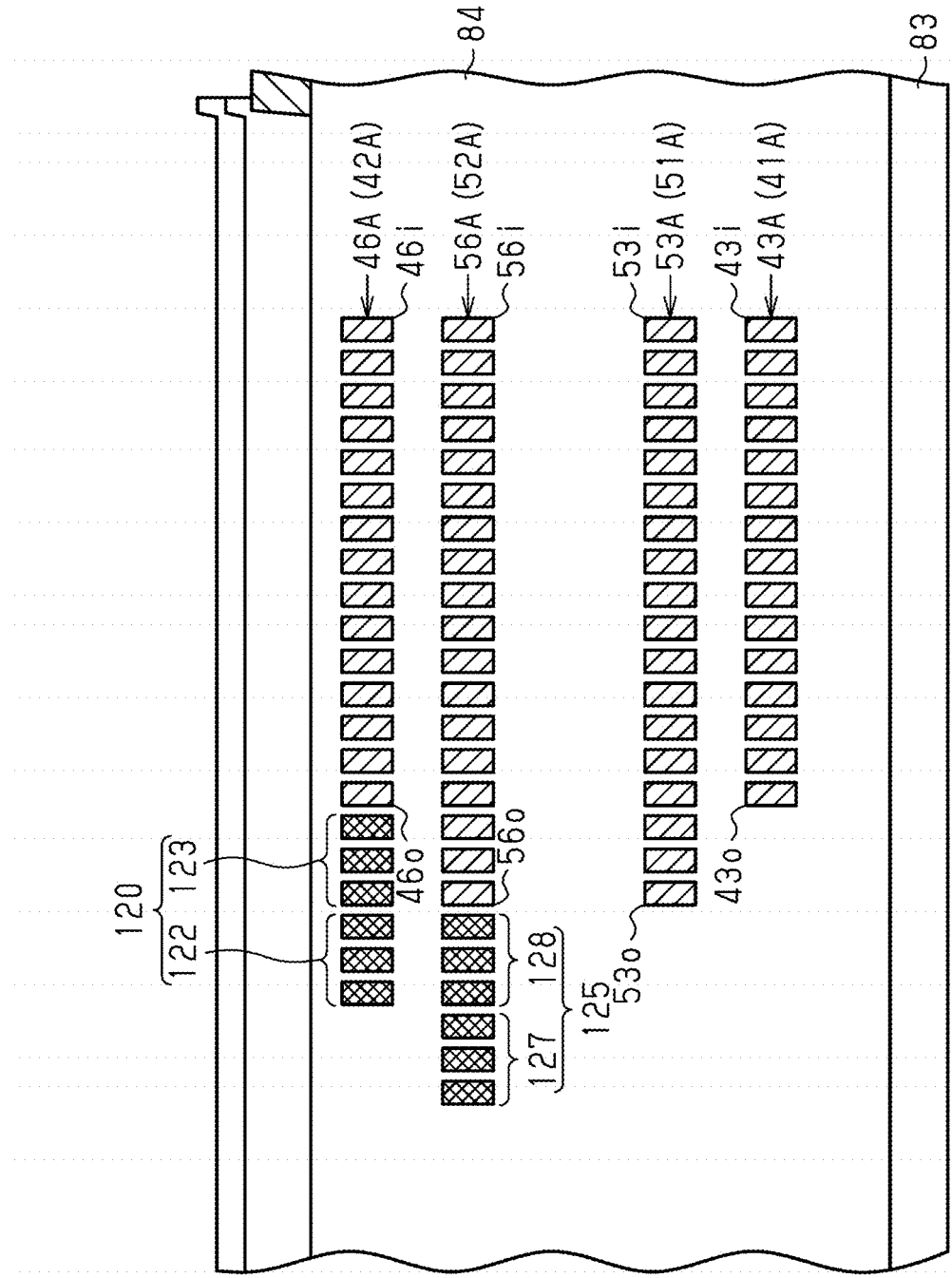
FIG. 18 is a schematic cross-sectional view of a modified example of a transformer chip showing a first coil, a second coil, a dummy pattern, a first capacitor electrode, and a second capacitor electrode.

As shown in FIG. 18, the outer end 53o of the first electrode wiring 53A of the first capacitor electrode 51A is located at an outer side of the outer end 43o of the first coil wiring 43A of the first coil 41A. The first electrode wiring 53A of the first capacitor electrode 51A includes an inner end 53i located at the same position as the inner end 43i of the first coil wiring 43A of the first coil 41A. The second electrode wiring 56A of the second capacitor electrode 52A includes an outer end 56o located at an outer side of an outer end 46o of the second coil wiring 46A of the second coil 42A. The second electrode wiring 56A of the second capacitor electrode 52A includes an inner end 56i located at the same position as an inner end 46i of the second coil wiring 46A of the second coil 42A.

Figure 19:
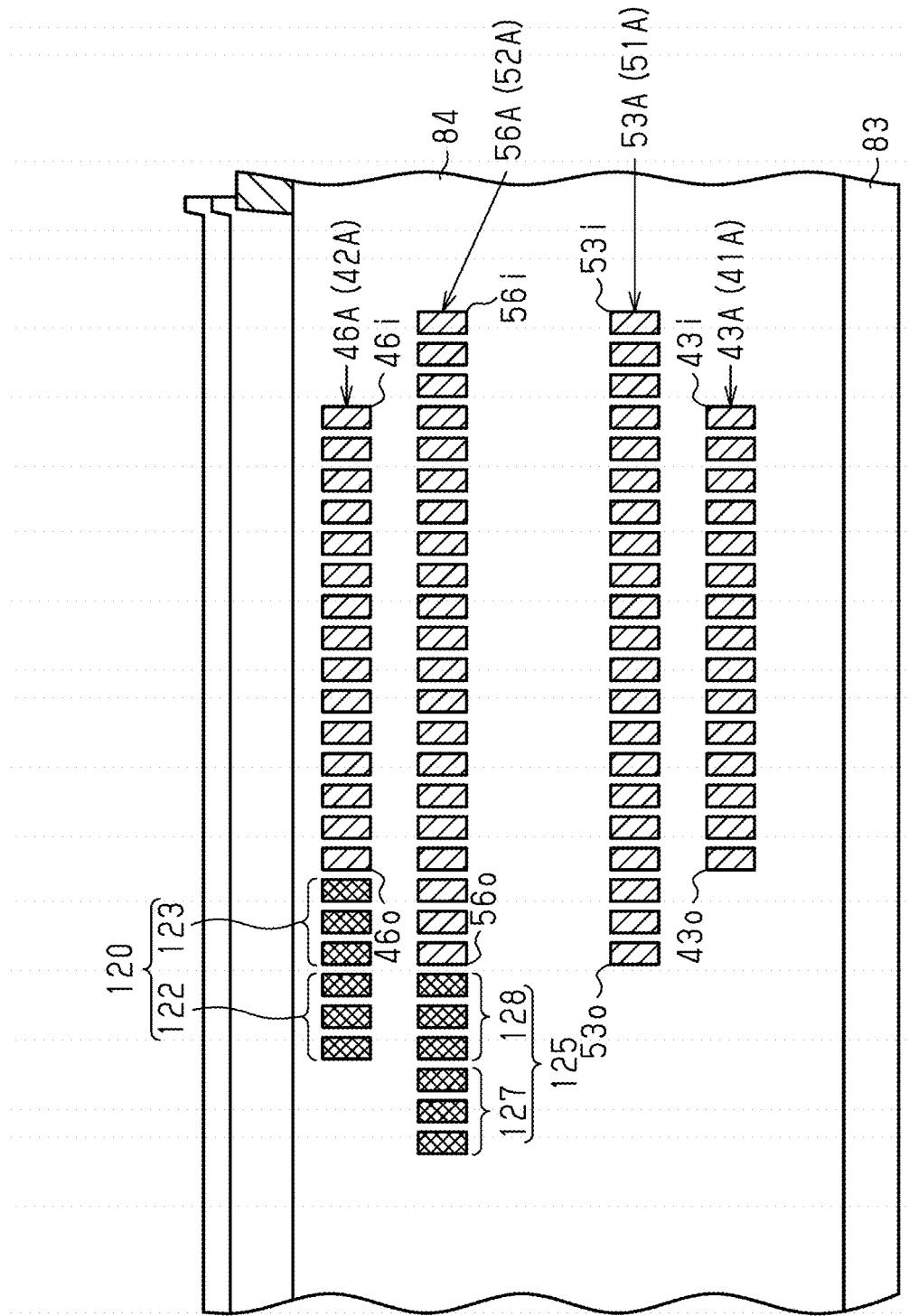
FIG. 19 is a schematic cross-sectional view of a modified example of a transformer chip showing a first coil, a second coil, a dummy pattern, a first capacitor electrode, and a second capacitor electrode.

As shown in FIG. 19, the outer end 53o of the first electrode wiring 53A of the first capacitor electrode 51A is located at an outer side of the outer end 43o of the first coil wiring 43A of the first coil 41A. The inner end 53i of the first electrode wiring 53A of the first capacitor electrode 51A is located at an inner side of the inner end 43i of the first coil wiring 43A of the first coil 41A. The outer end 56o of the second electrode wiring 56A of the second capacitor electrode 52A is located at an outer side of the outer end 46o of the second coil wiring 46A of the second coil 42A. The inner end 56i of the second electrode wiring 56A of the second capacitor electrode 52A is located at an inner side of the inner end 46i of the second coil wiring 46A of the second coil 42A.

Figure 20:
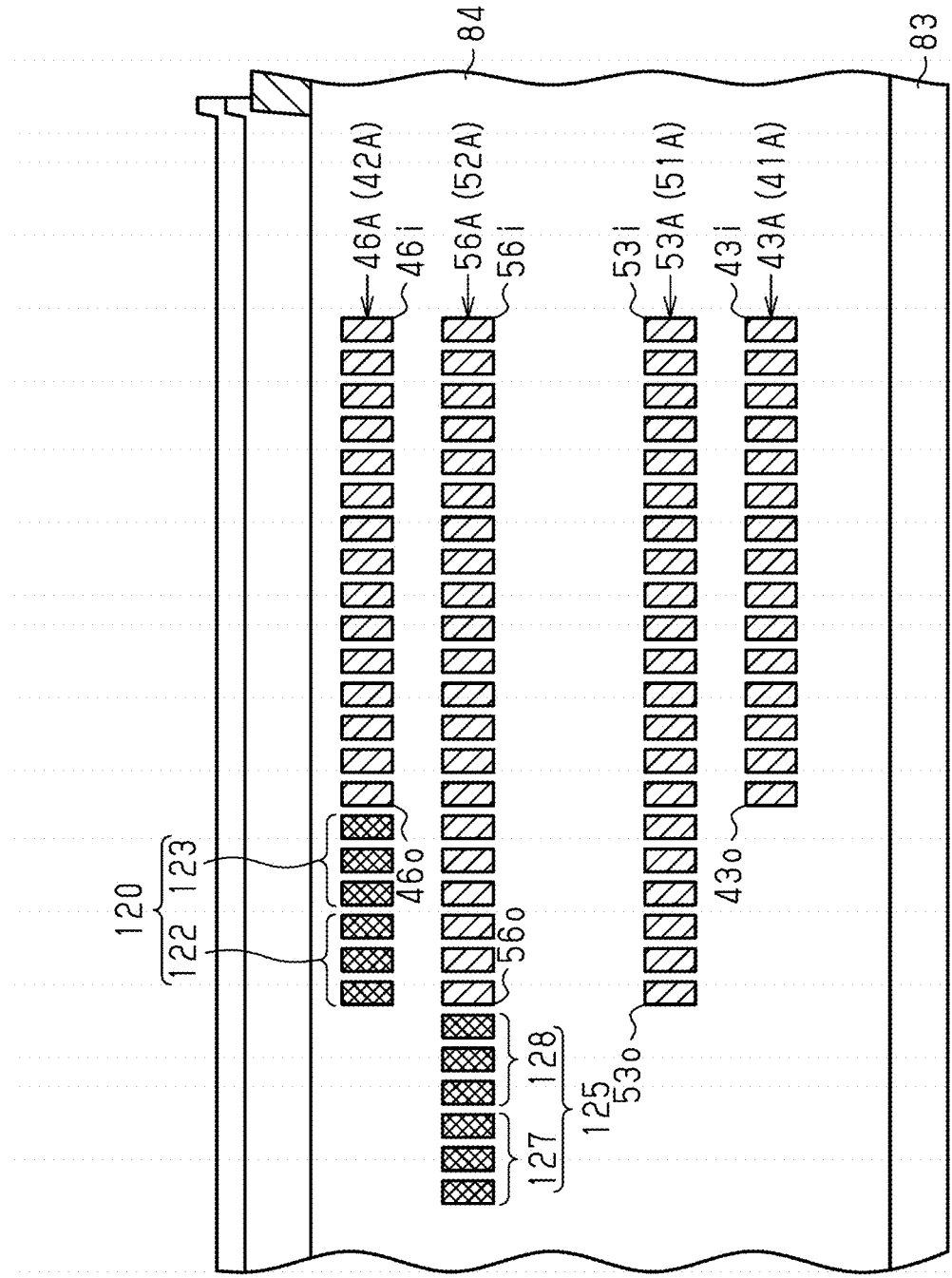
FIG. 20 is a schematic cross-sectional view of a modified example of a transformer chip showing a first coil, a second coil, a dummy pattern, a first capacitor electrode, and a second capacitor electrode.

As shown in FIG. 20, the first electrode wiring 53A of the first capacitor electrode 51A and the second electrode wiring 56A of the second capacitor electrode 52A overlap the second coil wiring 46A of the second coil 42A and the dummy pattern 120. More specifically, the outer end 53o of the first electrode wiring 53A of the first capacitor electrode 51A is located at the same position as the outer end of the dummy pattern 120 formed at an outer side of the second coil wiring 46A of the second coil 42A. In the same manner, the outer end 56o of the second electrode wiring 56A of the second capacitor electrode 52A is located at the same position as the outer end of the dummy pattern 120 formed at an outer side of the second coil wiring 46A of the second coil 42A. The first electrode wiring 53A of the first capacitor electrode 51A includes an inner end 53i located at the same position as the inner end 43i of the first coil wiring 43A of the first coil 41A. The second electrode wiring 56A of the second capacitor electrode 52A includes an inner end 56i located at the same position as an inner end 46i of the second coil wiring 46A of the second coil 42A.

Figure 21:
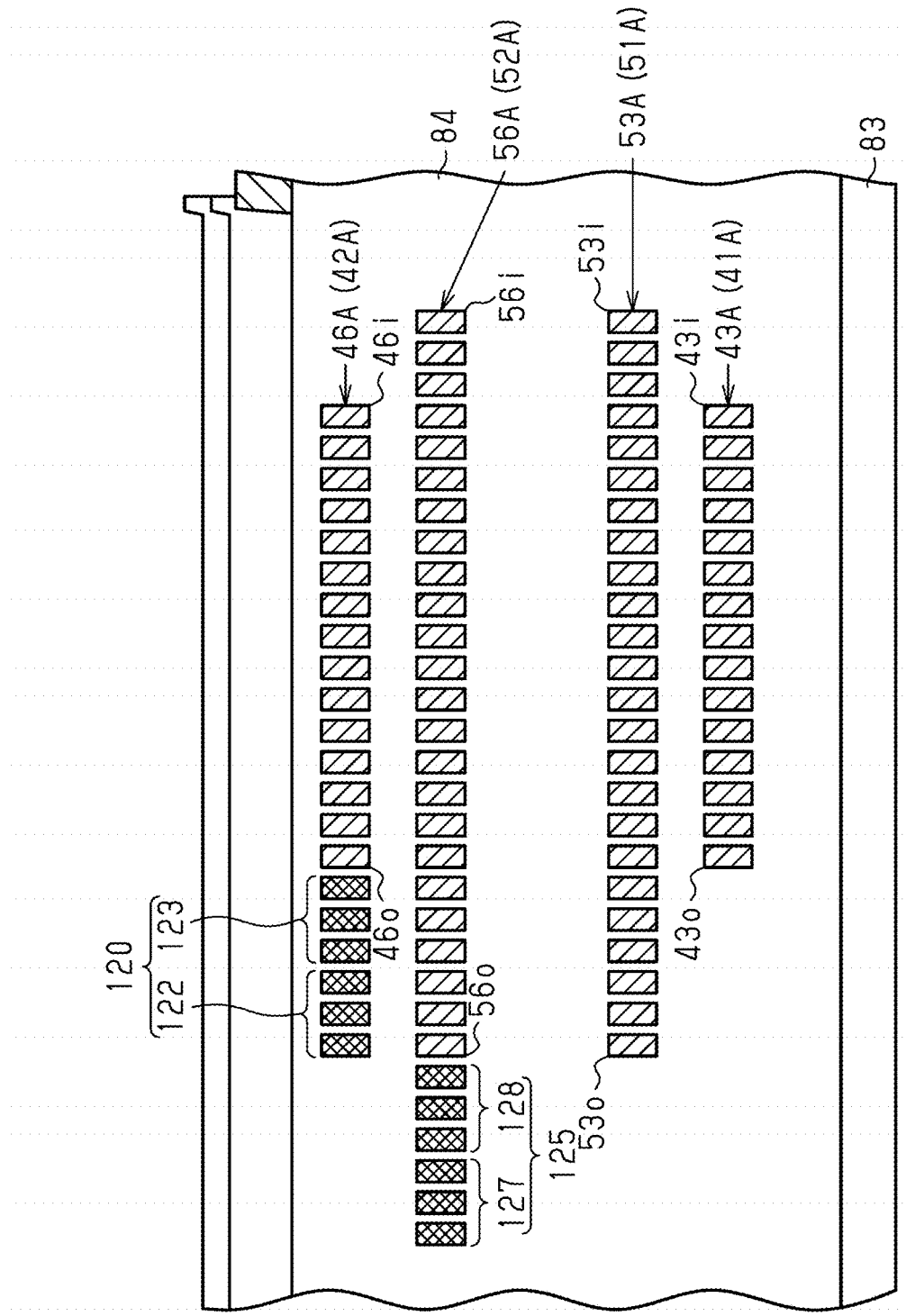
FIG. 21 is a schematic cross-sectional view of a modified example of a transformer chip showing a first coil, a second coil, a dummy pattern, a first capacitor electrode, and a second capacitor electrode.

As shown in FIG. 21, the first electrode wiring 53A of the first capacitor electrode 51A and the second electrode wiring 56A of the second capacitor electrode 52A overlap the second coil wiring 46A of the second coil 42A and the dummy pattern 120. More specifically, the outer end 53o of the first electrode wiring 53A of the first capacitor electrode 51A is located at the same position as the outer end of the dummy pattern 120 formed at an outer side of the second coil wiring 46A of the second coil 42A. In the same manner, the outer end 56o of the second electrode wiring 56A of the second capacitor electrode 52A is located at the same position as the outer end of the dummy pattern 120 formed at an outer side of the second coil wiring 46A of the second coil 42A. The inner end 53i of the first electrode wiring 53A of the first capacitor electrode 51A is located at an inner side of the inner end 43i of the first coil wiring 43A of the first coil 41A. The inner end 56i of the second electrode wiring 56A of the second capacitor electrode 52A is located at an inner side of the inner end 46i of the second coil wiring 46A of the second coil 42A.

Figure 22:
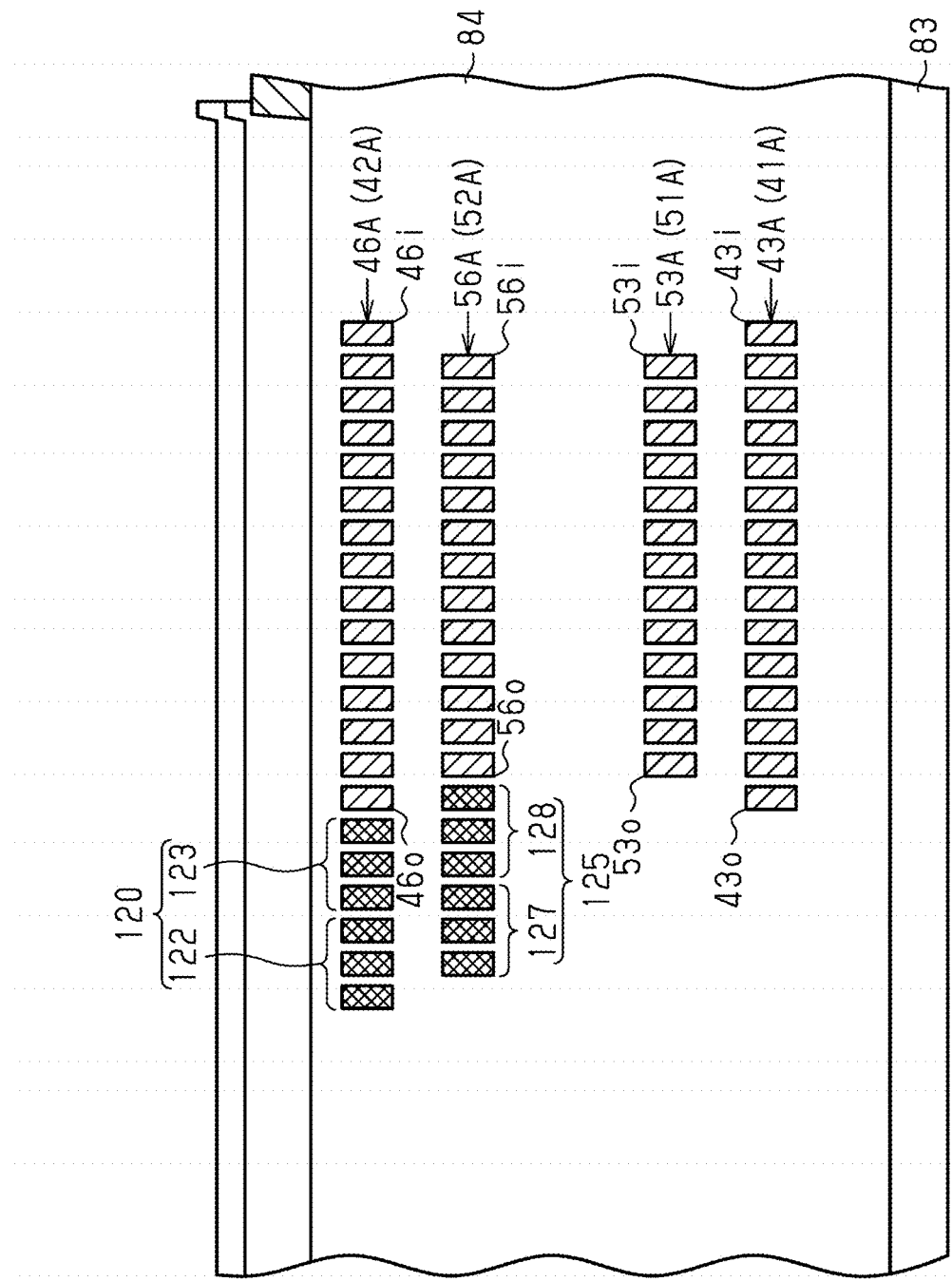
FIG. 22 is a schematic cross-sectional view of a modified example of a transformer chip showing a first coil, a second coil, a dummy pattern, a first capacitor electrode, and a second capacitor electrode.

As shown in FIG. 22, the outer end 53o of the first electrode wiring 53A of the first capacitor electrode 51A is located at an inner side of the outer end 43o of the first coil wiring 43A of the first coil 41A. The inner end 53i of the first electrode wiring 53A of the first capacitor electrode 51A is located at an outer side of the inner end 43i of the first coil wiring 43A of the first coil 41A. The outer end 56o of the second electrode wiring 56A of the second capacitor electrode 52A is located at an inner side of the outer end 46o of the second coil wiring 46A of the second coil 42A. The inner end 56*i* of the second electrode wiring 56A of the second capacitor electrode 52A is located at an outer side of the inner end 46*i* of the second coil wiring 46A of the second coil 42A.

Figure 23:
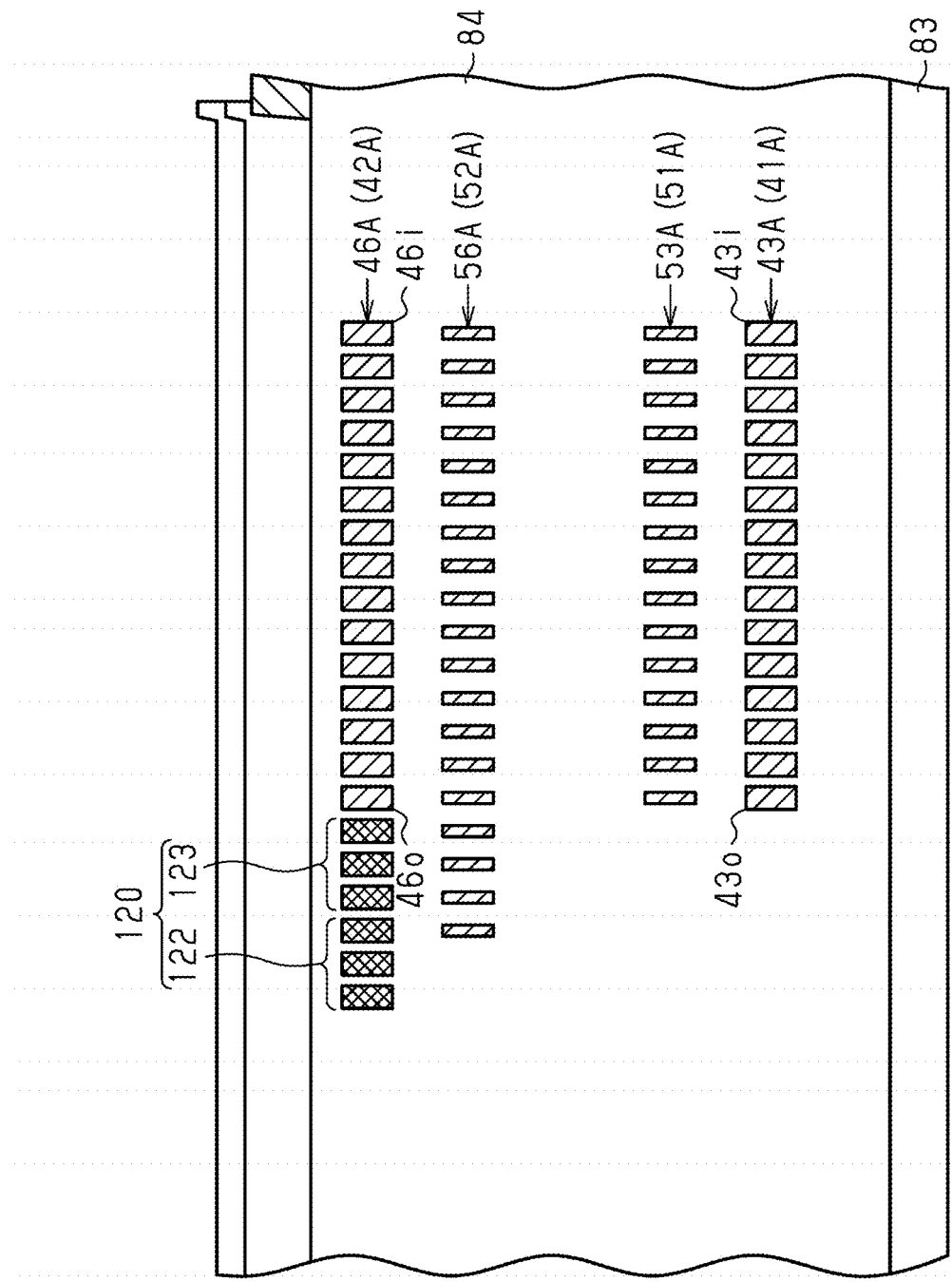
FIG. 23 is a schematic cross-sectional view of a modified example of a transformer chip showing a first coil, a second coil, a dummy pattern, a first capacitor electrode, and a second capacitor electrode.

As shown in FIG. 23, the width of the first electrode wiring 53A of the first capacitor electrode 51A is set to be less than the width of the first coil wiring 43A of the first coil 41A. That is, the ratio of wiring width to wiring spacing of the first electrode wiring 53A is set to be less than the ratio of wiring width to wiring spacing of the first coil wiring 43A. The width of the second electrode wiring 56A of the second capacitor electrode 52A is set to be less than the width of the second coil wiring 46A of the second coil 42A. That is, the ratio of wiring width to wiring spacing of the second electrode wiring 56A is set to be less than the ratio of wiring width to wiring spacing of the second coil wiring 46A.

Figure 24:
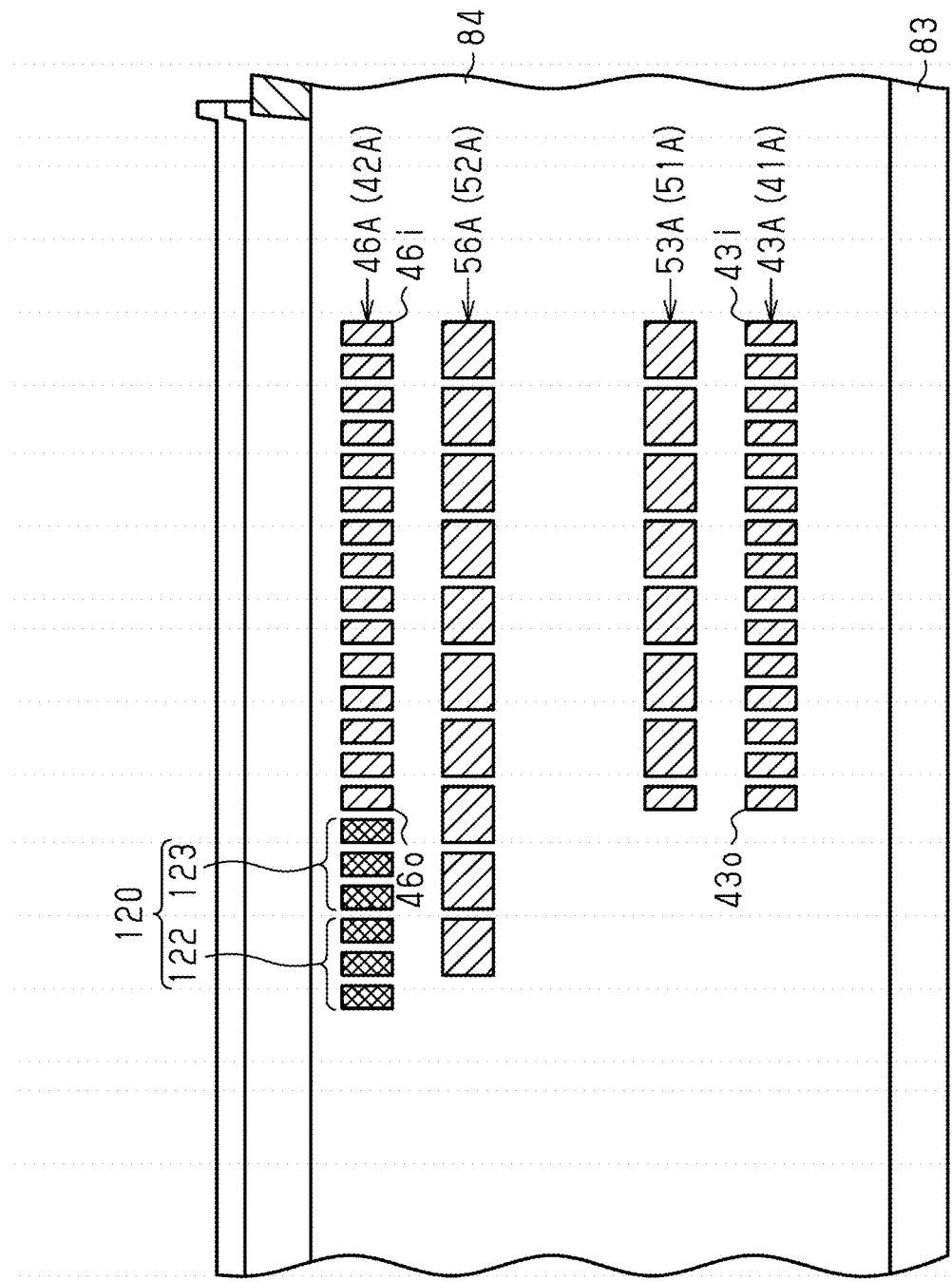
FIG. 24 is a schematic cross-sectional view of a modified example of a transformer chip showing a first coil, a second coil, a dummy pattern, a first capacitor electrode, and a second capacitor electrode.

As shown in FIG. 24, the width of the first electrode wiring 53A of the first capacitor electrode 51A is set to be greater than the width of the first coil wiring 43A of the first coil 41A. That is, the ratio of wiring width to wiring spacing of the first electrode wiring 53A is set to be greater than the ratio of wiring width to wiring spacing of the first coil wiring 43A. The width of the second electrode wiring 56A of the second capacitor electrode 52A is set to be greater than the width of the second coil wiring 46A of the second coil 42A. That is, the ratio of wiring width to wiring spacing of the second electrode wiring 56A is set to be greater than the ratio of wiring width to wiring spacing of the second coil wiring 46A.

As described above, the shape of the first coil wiring 43A (first coil 41A) and the second coil wiring 46A (second coil 42A) may be set in any manner. The shape of the first electrode wiring 53A (first capacitor electrode 51A) and the second electrode wiring 56A (second capacitor electrode 52A) may be set in any manner. In an example, in the z-direction, the thickness of the first coil wiring 43A and the second coil wiring 46A may differ from the thickness of the first electrode wiring 53A and the second electrode wiring 56A.

In the embodiments, the passivation film 160 is not limited to a material including silicon nitride and may be any layer that protects the insulation layer 84.

In the embodiments, the arrangement of the transformers 40A and 40B and the capacitors 50A and 50B may be changed in any manner. In an example, the transformer 40A, the transformer 40A, the transformer 40B, and the transformer 40B may be arranged in this order from the chip side surface 80*c* toward the chip side surface 80*d* of the transformer chip 80. The capacitors 50A and 50B are arranged in accordance with the positions of the transformers 40A and 40B.

In the embodiments, the first dummy pattern 121 of the dummy pattern 120 is electrically connected to the second coil 42B. However, there is no limit to such a configuration. In an example, the first dummy pattern 121 may be arranged independently of the second coils 42A and 42B. In other words, the first dummy pattern 121 may be configured not to be electrically connected to the second coils 42A and 42B. In the embodiments, the third dummy pattern 123 is electrically connected to the first dummy pattern 121. However, there is no limit to such a configuration. In an example, the third dummy pattern 123 may be configured not to be electrically connected to the first dummy pattern 121.

In the embodiments, the first dummy pattern 126 of the dummy pattern 125 is electrically connected to the first capacitor electrode 51A. However, there is no limit to such a configuration. In an example, the first dummy pattern 126 may be arranged independently of the first capacitor electrodes 51A and 51B. That is, the first dummy pattern 126 may be configured not to be electrically connected to the first capacitor electrodes 51A and 51B. In the embodiments, the third dummy pattern 128 is electrically connected to the first dummy pattern 126. However, there is no limit to such a configuration. In an example, the third dummy pattern 128 may be configured not to be electrically connected to the first dummy pattern 126.

In the embodiments, the structure of the dummy pattern 120 corresponding to the second coils 42A and 42B may be changed in any manner. In an example, one or two of the first dummy pattern 121, the second dummy pattern 122, and the third dummy pattern 123 may be omitted from the dummy pattern 120. The dummy pattern 120 may be omitted from the transformer chip 80.

In the embodiments, the structure of the dummy pattern 125 corresponding to the second capacitor electrodes 52A and 52B may be changed in any manner. In an example, one or two of the first dummy pattern 126, the second dummy pattern 127, and the third dummy pattern 128 may be omitted from the dummy pattern 125. The dummy pattern 125 may be omitted from the transformer chip 80.

In the embodiments, the low-voltage circuit 20 and the transformer 40 are mounted on separate chips. However, there is no limit to such a configuration. The transformer 40 and the low-voltage circuit 20 may be mounted on a single chip. In an example, the low-voltage circuit 20 may be formed on the substrate 83 of the transformer chip 80. The transformer chip 80 is covered by the mold resin 110.

In the embodiments, the high-voltage circuit 30 and the transformer 40 are mounted on separate chips. However, there is no limit to such a configuration. The transformer 40 and the high-voltage circuit 30 may be mounted on a single chip. In an example, the high-voltage circuit 30 may be formed on the substrate 83 of the transformer chip 80. In this case, the transformer chip 80 is mounted on the high-voltage die pad 101. The transformer chip 80 is covered by the mold resin 110.

In the embodiments, the gate driver 10 may include an insulation module in which the transformers 40 are accommodated in a single package. The insulation module includes the transformer chip 80 and the mold resin 110 encapsulating the transformer chip 80. The insulation module may further include a die pad on which the transformer chip 80 is mounted, leads, and wires connecting the leads to the transformer chip 80. The mold resin 110 encapsulates the transformer chip 80, the die pad, and the wires. The leads are configured to be electrically connected to both the low-voltage circuit 20 and the high-voltage circuit 30.

In the embodiments, the gate driver 10 may include a low-voltage circuit unit in which the low-voltage circuit 20 and the transformer 40 are accommodated in a single package. The low-voltage circuit unit may include the low-voltage circuit chip 60, the transformer chip 80, and the mold resin 110 encapsulating the low-voltage circuit chip 60 and the transformer chip 80. The low-voltage circuit unit may further include a die pad, first leads, first wires connecting the first leads to the low-voltage circuit chip 60, second leads, and second wires connecting the second leads to the transformer chip 80. The mold resin 110 encapsulates at least the low-voltage circuit chip 60, the transformer chip 80, the die pad, and the wires. In an example, the first leads are configured to be electrically connected to the ECU 503, and the second leads are configured to be electrically connected to the high-voltage circuit 30.

In the embodiments, the gate driver 10 may include a high-voltage circuit unit in which the high-voltage circuit 30 and the transformer 40 are accommodated in a single package. The high-voltage circuit unit may include the high-voltage circuit chip 70, the transformer chip 80, and the mold resin 110 encapsulating the high-voltage circuit chip 70 and the transformer chip 80. The high-voltage circuit unit may further include a die pad, first leads, first wires connecting the first leads to the high-voltage circuit chip 70, second leads, and second wires connecting the second leads to the transformer chip 80. The mold resin 110 encapsulates at least the high-voltage circuit chip 70, the transformer chip 80, the die pad, and the wires. In an example, the first leads are configured to be electrically connected to the source of the switching element 501, and the second leads are configured to be electrically connected to the low-voltage circuit 20.

In the embodiments, the high-voltage circuit 30 may be configured to transmit a signal to the low-voltage circuit 20 through the transformer 40 and the capacitor 50. Alternatively, the low-voltage circuit 20 and the high-voltage circuit 30 may be configured to bidirectionally transmit signals to each other through the transformer 40 and the capacitor 50.

In the embodiments, the first coil 41A and the second coil 42A may have different number of windings, and the first coil 41B and the second coil 42B may have different number of windings. The first coil 41A and the second coil 42A may be wound in different directions, and the first coil 41B and the second coil 42B may be wound in different directions.

In the embodiments, the positions of the slits 51As and 51Bs shown in FIG. 7 may be changed in any manner. In FIG. 7, the slits 51As and 51Bs extend in the x-direction. Instead, the slits 51As and 51Bs may extend in the y-direction. The slits 51As and Bs may extend in the same direction, for example, a direction toward the chip side surface 80c. Also, the positions of the slits 52As and 52Bs shown in FIG. 8 may be changed. The slit 51As shown in FIG. 7 and the slit 52As shown in FIG. 8 may extend in different directions. Also, the slit 51Bs shown in FIG. 7 and the slit 52Bs shown in FIG. 8 may extend in different directions.

In the present disclosure, the term "on" includes the meaning of "above" in addition to the meaning of "on" unless otherwise clearly indicated in the context. Thus, the phrase "A is formed on B" is intended to mean that A may be disposed directly on B in contact with B in the present embodiment and also that A may be disposed above B without contacting B in a modified example. In other words, the term "on" does not exclude a structure in which another member is formed between A and B.

The z-direction as referred to in the present disclosure does not necessarily have to be the vertical direction and does not necessarily have to fully conform to the vertical direction. In the structures according to the present disclosure, "upward" and "downward" in the z-direction as referred to in the present description are not limited to "upward" and "downward" in the vertical direction. In an example, the x-direction may conform to the vertical direction. In another example, the y-direction may conform to the vertical direction.

In this specification, "at least one of A and B" should be understood to mean "only A, only B, or both A and B."

REFERENCE SIGNS LIST 10) gate driver
20) low-voltage circuit
21A, 21B) low-voltage signal line
30) high-voltage circuit
31A, 31B) high-voltage signal line
40) transformer
40B) transformer
41A, 41B) first coil
42A, 42B) second coil
43A, 43B) first coil wiring
43i) inner end
43o) outer end
44A, 44B) first signal terminal
45) first ground terminal
46A, 46B) second coil wiring
46i) inner end
46o) outer end
47A, 47B) second signal terminal
48) second ground terminal
50) capacitor
50B) capacitor
51A, 51B) first capacitor electrode
51As, 51Bs) first slit
52A, 52B) second capacitor electrode
52As, 52Bs) second slit
53A, 53B) first electrode wiring
53i) inner end
53o) outer end
54A, 54B) first capacitor end
55) first capacitor ground terminal
55B) interconnect
56A, 56B) second electrode wiring
56i) inner end
56o) outer end
57A, 57B) second capacitor end
58) second capacitor ground terminal
58A, 58B) interconnect
60) low-voltage circuit chip
60s) chip main surface
61) first electrode pad
62) second electrode pad
63) third electrode pad
70) high-voltage circuit chip
70s) chip main surface
71) first electrode pad
72) second electrode pad
73) third electrode pad
80) transformer chip
80a to 80d) chip side surface
80r) chip back surface
80s) chip main surface
81) first electrode pad
81A to 81C) first electrode pad
82) second electrode pad
82A to 82C) second electrode pad
83) substrate
83r) substrate back surface
83s) substrate main surface
84) insulation layer
84s) surface
85) insulation film
851 to 854) insulation film
85A) first insulation film
85B) second insulation film
85L) insulation film
85U) insulation film
86) shield electrode
87) inner region
88) outer region
89) via 90) low-voltage lead frame
91) low-voltage die pad
92) low-voltage lead
100) high-voltage lead frame
101) high-voltage die pad
102) high-voltage lead
110) mold resin
111 to 114) resin side surface
120) dummy pattern
121) first dummy pattern
122) second dummy pattern
123) third dummy pattern
125) dummy pattern
126) first dummy pattern
127) second dummy pattern
128) third dummy pattern
131A to 131C) interconnect
132A, 132C) first interconnect part
133A, 133C) second interconnect part
134A, 134C) via
135A, 135C) via
136 to 138) via
141) coil groove
142) barrier film
143) body layer
144) capacitor groove
145) barrier film
146) body layer
150) protection film
160) passivation film
180) resin layer
181) inner resin layer
182) outer resin layer
183) separation groove
184) first resin opening
185) second resin opening
500) inverter device
501, 502) switching element
503) ECU
GND1, GND2) ground
i) current
$i_{1A}$, $i_{1B}$) current
$i_{2A}$, $i_{2B}$) current
$i_{CA}$, $i_{CB}$) current
SD) conductive bonding material
V1) first voltage
V2) second voltage
W1 to W4) wire

The invention claimed is:

1. An insulating transformer, comprising:
an insulation layer;
a transformer including a first coil embedded in the insulation layer and including a first signal terminal and a first ground terminal and being configured to receive a low voltage with the first signal terminal and a second coil embedded in a location separated from the first coil in a thickness-wise direction of the insulation layer and including a second signal terminal and a second ground terminal and being configured to receive a high voltage with the second signal terminal;
a capacitor including a first capacitor electrode and a second capacitor electrode, the first capacitor electrode being arranged between the first coil and the second coil and connected to the first ground terminal, and the second capacitor electrode being arranged between the first capacitor electrode and the second coil and connected to the second ground terminal;
a dummy coil pattern arranged around the second coil and connected to the second coil; and
a dummy electrode pattern arranged around the second capacitor electrode and connected to the second capacitor electrode.

2. The insulating transformer according to claim 1, wherein as viewed in the thickness-wise direction, the first capacitor electrode is arranged to overlap the first coil, and the second capacitor electrode is arranged to overlap the second coil.

3. The insulating transformer according to claim 1, wherein
the insulation layer includes insulation films stacked in the thickness-wise direction,
the first coil, the second coil, the first capacitor electrode, and the second capacitor electrode are formed in the insulation films so as to differ from each other in position in the thickness-wise direction,
at least one of the insulation films is arranged between the first coil and the first capacitor electrode,
at least one of the insulation films is arranged between the second coil and the second capacitor electrode, and
at least one of the insulation films is arranged between the first capacitor electrode and the second capacitor electrode.

4. The insulating transformer according to claim 3, wherein
the first coil is embedded in a first coil groove extending through the insulation film in the thickness-wise direction, and
the second coil is embedded in a second coil groove extending through the insulation film in the thickness-wise direction.

5. The insulating transformer according to claim 3, wherein
the first capacitor electrode is embedded in a first capacitor groove extending through the insulation film in the thickness-wise direction, and
the second capacitor electrode is embedded in a second capacitor groove extending through the insulation film in the thickness-wise direction.

6. The insulating transformer according to claim 1, wherein at least one of the first capacitor electrode and the second capacitor electrode is formed from a material including a nonmagnetic element.

7. The insulating transformer according to claim 1, wherein
as viewed in the thickness-wise direction, the first capacitor electrode is annular and open and includes a first slit extending in a direction from a center of the first coil toward an outer side of the first coil, and
as viewed in the thickness-wise direction, the second capacitor electrode is annular and open and includes a second slit extending in a direction from a center of the second coil toward an outer side of the second coil.

8. The insulating transformer according to claim 1, wherein
the first coil includes a spiral first coil wiring, the first ground terminal connected to one end of the first coil wiring, and the first signal terminal connected to another end of the first coil wiring, and
the second coil includes a spiral second coil wiring, the second ground terminal connected to one end of the second coil wiring, and the second signal terminal connected to another end of the second coil wiring.

9. The insulating transformer according to claim 8, wherein as viewed in the thickness-wise direction, the first capacitor electrode includes a first electrode wiring overlapping the first coil wiring, a first capacitor end overlapping the first signal terminal, and a first capacitor ground terminal overlapping the first ground terminal, as viewed in the thickness-wise direction, the second capacitor electrode includes a second electrode wiring overlapping the second coil wiring, a second capacitor end overlapping the second signal terminal, and a second capacitor ground terminal overlapping the second ground terminal.

10. The insulating transformer according to claim 9, wherein the first electrode wiring is set to be equal to the first coil wiring in ratio of wiring width to wiring spacing, and the second electrode wiring is set to be equal to the second coil wiring in ratio of wiring width to wiring spacing.

11. The insulating transformer according to claim 8, wherein the first capacitor electrode is plate-shaped and continuous from an inner end of the first coil wiring to an outer end of the first coil wiring as viewed in the thickness-wise direction, and the second capacitor electrode is plate-shaped and continuous from an inner end of the second coil wiring to an outer end of the second coil wiring as viewed in the thickness-wise direction.

12. The insulating transformer according to claim 9, wherein as viewed in the thickness-wise direction, an outer end of the second electrode wiring is located at either an outer side of an outer end of the second coil wiring, or a same position as an outer end of the second coil wiring.

13. The insulating transformer according to claim 12, wherein as viewed in the thickness-wise direction, an inner end of the second electrode wiring is located at either a same position as an inner end of the second coil wiring or an inner side of an inner end of the second coil wiring.

14. The insulating transformer according to claim 12, wherein as viewed in the thickness-wise direction, an outer end of the first electrode wiring is located at either an outer side of an outer end of the first coil wiring or a same position as an outer end of the first coil wiring.

15. The insulating transformer according to claim 14, wherein as viewed in the thickness-wise direction, an inner end of the first electrode wiring is located at a same position as an inner end of the first coil wiring.

16. The insulating transformer according to claim 14, wherein as viewed in the thickness-wise direction, an inner end of the first electrode wiring is located at an inner side of an inner end of the first coil wiring.

17. The insulating transformer according to claim 1, further comprising:

a chip main surface and a chip back surface facing opposite directions in the thickness-wise direction, wherein the second coil is located close to the chip main surface.

* * * * *